United States Patent
Draeger et al.

(10) Patent No.: US 10,049,921 B2
(45) Date of Patent: Aug. 14, 2018

(54) METHOD FOR SELECTIVELY SEALING ULTRA LOW-K POROUS DIELECTRIC LAYER USING FLOWABLE DIELECTRIC FILM FORMED FROM VAPOR PHASE DIELECTRIC PRECURSOR

(71) Applicant: Lam Research Corporation, Fremont, CA (US)

(72) Inventors: Nerissa Sue Draeger, Fremont, CA (US); Kaihan Abidi Ashtiani, Cupertino, CA (US); Deenesh Padhi, Sunnyvale, CA (US); Derek B. Wong, San Jose, CA (US); Bart J. van Schravendijk, Palo Alto, CA (US); George Andrew Antonelli, Portland, OR (US); Artur Kolics, Dublin, CA (US); Lie Zhao, Lake Oswego, OR (US); Patrick A. van Cleemput, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/464,071

(22) Filed: Aug. 20, 2014

(65) Prior Publication Data

US 2016/0056071 A1    Feb. 25, 2016

(51) Int. Cl.
*H01L 21/768* (2006.01)
*C23C 16/04* (2006.01)
(Continued)

(52) U.S. Cl.
CPC ...... *H01L 21/76826* (2013.01); *C23C 16/045* (2013.01); *C23C 16/401* (2013.01);
(Continued)

(58) Field of Classification Search
CPC ......... H01L 21/02164; H01L 21/02211; H01L 21/02277; H01L 21/02345; H01L 21/0234
See application file for complete search history.

(56) References Cited

U.S. PATENT DOCUMENTS

| 4,099,990 A | 7/1978 | Brown et al. |
| 4,740,480 A | 4/1988 | Ooka |

(Continued)

FOREIGN PATENT DOCUMENTS

| CN | 1655330 A | 8/2005 |
| CN | 1722403 A | 1/2006 |

(Continued)

OTHER PUBLICATIONS

U.S. Appl. No. 14/464,196, filed Aug. 20, 2014, entitled "Low-K Oxide Deposition by Hydrolysis and Condensation."

(Continued)

*Primary Examiner* — Michael Jung
(74) *Attorney, Agent, or Firm* — Weaver Austin Villeneuve & Sampson LLP

(57) ABSTRACT

Implementations of the methods and apparatus disclosed herein relate to pore sealing of porous dielectric films using flowable dielectric material. The methods involve exposing a substrate having an exposed porous dielectric film thereon to a vapor phase dielectric precursor under conditions such that a flowable dielectric material selectively deposits in the pores of the porous dielectric material. The pores can be filled with the deposited flowable dielectric material without depositing a continuous film on any exposed metal surface.

19 Claims, 13 Drawing Sheets

(51) Int. Cl.
*C23C 16/40* (2006.01)
*C23C 16/56* (2006.01)
*H01L 23/532* (2006.01)

(52) U.S. Cl.
CPC ........ *C23C 16/56* (2013.01); *H01L 21/76814* (2013.01); *H01L 21/76831* (2013.01); *H01L 21/76843* (2013.01); *H01L 21/76876* (2013.01); *H01L 23/5329* (2013.01); *H01L 23/53238* (2013.01); *H01L 21/76825* (2013.01)

(56) References Cited

U.S. PATENT DOCUMENTS

| | | |
|---|---|---|
| 4,923,720 A | 5/1990 | Lee et al. |
| 5,281,274 A | 1/1994 | Yoder |
| 5,320,983 A | 6/1994 | Ouellet |
| 5,382,311 A | 1/1995 | Ishikawa et al. |
| 5,387,546 A | 2/1995 | Maeda et al. |
| 5,462,603 A | 10/1995 | Murakami |
| 5,516,721 A | 5/1996 | Galli et al. |
| 5,525,157 A | 6/1996 | Hawkins et al. |
| 5,534,731 A | 7/1996 | Cheung |
| 5,558,717 A | 9/1996 | Zhao et al. |
| 5,747,381 A | 5/1998 | Wu et al. |
| 5,753,886 A | 5/1998 | Iwamura et al. |
| 5,775,808 A | 7/1998 | Pan |
| 5,796,074 A | 8/1998 | Edelstein et al. |
| 5,807,785 A | 9/1998 | Ravi |
| 5,840,631 A | 11/1998 | Kubo et al. |
| 5,858,880 A | 1/1999 | Dobson et al. |
| 5,874,367 A | 2/1999 | Dobson |
| 5,879,574 A | 3/1999 | Sivaramakrishnan et al. |
| 5,899,751 A | 5/1999 | Chang et al. |
| 5,902,127 A | 5/1999 | Park |
| 5,903,428 A | 5/1999 | Grimard et al. |
| 5,911,833 A | 6/1999 | Denison et al. |
| 5,932,289 A | 8/1999 | Dobson et al. |
| 5,970,383 A | 10/1999 | Lee |
| 5,990,013 A | 11/1999 | Berenguer et al. |
| 6,001,183 A | 12/1999 | Gurary et al. |
| 6,013,581 A | 1/2000 | Wu et al. |
| 6,035,101 A | 3/2000 | Sajoto et al. |
| 6,054,379 A | 4/2000 | Yau et al. |
| 6,060,384 A | 5/2000 | Chen et al. |
| 6,072,227 A | 6/2000 | Yau et al. |
| 6,114,224 A | 9/2000 | Ngo et al. |
| 6,114,259 A | 9/2000 | Sukharev et al. |
| 6,143,626 A | 11/2000 | Yabu et al. |
| 6,207,535 B1 | 3/2001 | Lee et al. |
| 6,218,268 B1 | 4/2001 | Xia et al. |
| 6,235,146 B1 | 5/2001 | Kadotani et al. |
| 6,242,366 B1 | 6/2001 | Beekman et al. |
| 6,251,759 B1 | 6/2001 | Guo et al. |
| 6,287,989 B1 | 9/2001 | Dobson |
| 6,300,219 B1 | 10/2001 | Doan et al. |
| 6,309,933 B1 | 10/2001 | Li et al. |
| 6,323,123 B1 | 11/2001 | Liu et al. |
| 6,383,951 B1 | 5/2002 | Li |
| 6,399,213 B2 | 6/2002 | Shiokawa |
| 6,413,583 B1 | 7/2002 | Moghadam et al. |
| 6,439,244 B1 | 8/2002 | Wu |
| 6,448,187 B2 | 9/2002 | Yau et al. |
| 6,475,564 B1 | 11/2002 | Carter et al. |
| 6,544,858 B1 | 4/2003 | Beekman et al. |
| 6,605,955 B1 | 8/2003 | Costello et al. |
| 6,613,695 B2 | 9/2003 | Pomarede et al. |
| 6,635,586 B2 | 10/2003 | Goo et al. |
| 6,640,840 B1 | 11/2003 | MacNeil |
| 6,653,247 B2 | 11/2003 | MacNeil |
| 6,660,663 B1 | 12/2003 | Cheung et al. |
| 6,740,853 B1 | 5/2004 | Johnson et al. |
| 6,743,436 B1 | 6/2004 | Lee |
| 6,743,736 B2 | 6/2004 | Mardian et al. |
| 6,787,463 B2 | 9/2004 | Mardian et al. |
| 6,790,737 B2 | 9/2004 | Schneegans et al. |
| 6,812,135 B2 | 11/2004 | Li et al. |
| 6,828,162 B1 | 12/2004 | Halliyal et al. |
| 6,846,757 B2 | 1/2005 | MacNeil |
| 6,858,195 B2 | 2/2005 | Aronowitz et al. |
| 6,902,947 B2 | 6/2005 | Chinn et al. |
| 6,972,262 B2 | 12/2005 | Lee et al. |
| 6,984,561 B2 | 1/2006 | Herner et al. |
| 6,995,056 B2 | 2/2006 | Lee et al. |
| 7,033,945 B2 | 4/2006 | Byun et al. |
| 7,056,560 B2 | 6/2006 | Yim et al. |
| 7,071,126 B2 | 7/2006 | Johnston et al. |
| 7,074,690 B1 | 7/2006 | Gauri et al. |
| 7,074,727 B2 | 7/2006 | Hsu et al. |
| 7,084,505 B2 | 8/2006 | Hamada et al. |
| 7,091,453 B2 | 8/2006 | Murayama et al. |
| 7,153,783 B2 | 12/2006 | Lu et al. |
| 7,211,525 B1 | 5/2007 | Shanker et al. |
| 7,235,137 B2 | 6/2007 | Kitayama et al. |
| 7,238,604 B2 | 7/2007 | Kloster et al. |
| 7,271,112 B1 | 9/2007 | Papasouliotis et al. |
| 7,311,782 B2 | 12/2007 | Strang et al. |
| 7,365,000 B2 | 4/2008 | Lee et al. |
| 7,480,129 B2 | 1/2009 | Brown et al. |
| 7,498,273 B2 | 3/2009 | Mallick et al. |
| 7,521,378 B2 | 4/2009 | Fucsko et al. |
| 7,524,735 B1 | 4/2009 | Gauri et al. |
| 7,575,633 B2 | 8/2009 | Romanin |
| 7,582,555 B1 | 9/2009 | Lang et al. |
| 7,585,704 B2 | 9/2009 | Belyansky et al. |
| 7,589,012 B1 | 9/2009 | Seo et al. |
| 7,622,369 B1 | 11/2009 | Lee et al. |
| 7,629,227 B1 | 12/2009 | Wang et al. |
| 7,648,927 B2 | 1/2010 | Singh et al. |
| 7,655,532 B1 | 2/2010 | Chen et al. |
| 7,670,436 B2 | 3/2010 | Miller et al. |
| 7,727,906 B1 | 6/2010 | Shanker et al. |
| 7,794,544 B2 | 9/2010 | Nguyen et al. |
| 7,804,130 B1 | 9/2010 | Fung |
| 7,825,044 B2 | 11/2010 | Mallick et al. |
| 7,888,233 B1 | 2/2011 | Gauri et al. |
| 7,888,273 B1 | 2/2011 | Wang et al. |
| 7,915,139 B1 | 3/2011 | Lang et al. |
| 7,947,551 B1 | 5/2011 | Syue et al. |
| 7,999,356 B2 | 8/2011 | Nakasaki et al. |
| 8,178,159 B2 | 5/2012 | Baikerikar et al. |
| 8,187,951 B1 | 5/2012 | Wang et al. |
| 8,278,224 B1 | 10/2012 | Mui et al. |
| 8,481,403 B1 | 7/2013 | Gauri et al. |
| 8,535,767 B1 | 9/2013 | Kimura |
| 8,557,712 B1 | 10/2013 | Antonelli et al. |
| 8,580,697 B1 | 11/2013 | Lang et al. |
| 8,664,287 B2 | 3/2014 | Shukla |
| 8,685,867 B1 | 4/2014 | Danek et al. |
| 8,728,958 B2 | 5/2014 | Ashtiani et al. |
| 8,809,161 B2 | 8/2014 | Gauri et al. |
| 8,846,536 B2 | 9/2014 | Draeger et al. |
| 9,064,684 B1 | 6/2015 | Mui et al. |
| 9,224,594 B2 | 12/2015 | Kashefi et al. |
| 9,245,739 B2 | 1/2016 | Ndiege et al. |
| 9,257,302 B1 | 2/2016 | Wang et al. |
| 9,299,559 B2 | 3/2016 | Draeger et al. |
| 9,502,255 B2 | 11/2016 | Antonelli et al. |
| 9,719,169 B2 | 8/2017 | Mohn et al. |
| 2002/0006729 A1 | 1/2002 | Geiger et al. |
| 2002/0007785 A1 | 1/2002 | Gujer et al. |
| 2002/0050246 A1 | 5/2002 | Parkhe |
| 2002/0066726 A1 | 6/2002 | Cole et al. |
| 2002/0076490 A1 | 6/2002 | Chiang et al. |
| 2002/0098627 A1 | 7/2002 | Pomarede et al. |
| 2003/0040199 A1 | 2/2003 | Agarwal |
| 2003/0066482 A1 | 4/2003 | Pokharna et al. |
| 2003/0077887 A1 | 4/2003 | Jang et al. |
| 2003/0121898 A1 | 7/2003 | Kane et al. |
| 2003/0124870 A1 | 7/2003 | Macneil et al. |
| 2003/0146416 A1 | 8/2003 | Takei et al. |
| 2003/0159655 A1 | 8/2003 | Lin et al. |
| 2003/0194861 A1 | 10/2003 | Mardian et al. |
| 2003/0207580 A1 | 11/2003 | Li et al. |
| 2003/0210065 A1 | 11/2003 | Lu et al. |

(56) References Cited

U.S. PATENT DOCUMENTS

| | | |
|---|---|---|
| 2004/0033639 A1 | 2/2004 | Chinn et al. |
| 2004/0048455 A1 | 3/2004 | Karasawa et al. |
| 2004/0152342 A1 | 8/2004 | Li et al. |
| 2004/0169005 A1 | 9/2004 | Kim et al. |
| 2004/0224496 A1 | 11/2004 | Cui et al. |
| 2005/0020074 A1* | 1/2005 | Kloster ............... H01L 21/3105 438/689 |
| 2005/0020093 A1 | 1/2005 | Ahn et al. |
| 2005/0026443 A1 | 2/2005 | Goo et al. |
| 2005/0064698 A1 | 3/2005 | Chang et al. |
| 2005/0112282 A1 | 5/2005 | Gordon |
| 2005/0136684 A1 | 6/2005 | Mukai et al. |
| 2005/0150453 A1 | 7/2005 | Simmons et al. |
| 2005/0181566 A1 | 8/2005 | Machida et al. |
| 2005/0191863 A1 | 9/2005 | Olmer et al. |
| 2005/0212179 A1 | 9/2005 | Honda et al. |
| 2005/0229849 A1 | 10/2005 | Silvetti et al. |
| 2005/0258542 A1* | 11/2005 | Fuller ............... H01L 21/76807 257/759 |
| 2005/0260864 A1 | 11/2005 | Huang et al. |
| 2006/0014384 A1 | 1/2006 | Lee et al. |
| 2006/0024912 A1 | 2/2006 | Lee |
| 2006/0172531 A1* | 8/2006 | Lin ............... H01L 21/76831 438/637 |
| 2006/0172552 A1* | 8/2006 | Ajmera ............... H01L 21/02126 438/778 |
| 2006/0183345 A1 | 8/2006 | Nguyen et al. |
| 2006/0216946 A1 | 9/2006 | Usami et al. |
| 2006/0223290 A1 | 10/2006 | Belyansky et al. |
| 2006/0269693 A1 | 11/2006 | Balseanu et al. |
| 2006/0270217 A1 | 11/2006 | Balseanu et al. |
| 2007/0054505 A1 | 3/2007 | Antonelli et al. |
| 2007/0224777 A1 | 9/2007 | Hamelin |
| 2007/0256785 A1 | 11/2007 | Pamarthy et al. |
| 2007/0258186 A1 | 11/2007 | Matyushkin et al. |
| 2007/0277734 A1 | 12/2007 | Lubomirsky et al. |
| 2007/0281495 A1 | 12/2007 | Mallick et al. |
| 2007/0296035 A1 | 12/2007 | George et al. |
| 2007/0298585 A1 | 12/2007 | Lubomirsky et al. |
| 2008/0020591 A1 | 1/2008 | Balseanu et al. |
| 2008/0054466 A1* | 3/2008 | Nasu ............... H01L 21/76843 257/751 |
| 2008/0066682 A1 | 3/2008 | Yamashita |
| 2008/0081434 A1 | 4/2008 | Nam et al. |
| 2008/0089001 A1 | 4/2008 | Parkhe et al. |
| 2008/0113178 A1 | 5/2008 | Lazovsky et al. |
| 2008/0132087 A1 | 6/2008 | Xia et al. |
| 2008/0199977 A1* | 8/2008 | Weigel ............... H01L 21/02126 438/4 |
| 2008/0274626 A1 | 11/2008 | Glowacki et al. |
| 2008/0295872 A1 | 12/2008 | Riker et al. |
| 2008/0318439 A1 | 12/2008 | Ito et al. |
| 2009/0020847 A1 | 1/2009 | Byun et al. |
| 2009/0053895 A1 | 2/2009 | Oshima et al. |
| 2009/0061647 A1 | 3/2009 | Mallick et al. |
| 2009/0104789 A1 | 4/2009 | Mallick et al. |
| 2009/0104790 A1 | 4/2009 | Liang |
| 2009/0159566 A1 | 6/2009 | Brillhart et al. |
| 2009/0159587 A1 | 6/2009 | Shimanuki et al. |
| 2009/0190908 A1 | 7/2009 | Shibagaki |
| 2009/0215282 A1 | 8/2009 | Moore et al. |
| 2009/0298257 A1 | 12/2009 | Lee et al. |
| 2009/0321936 A1 | 12/2009 | Kojima et al. |
| 2010/0000684 A1 | 1/2010 | Choi |
| 2010/0109155 A1 | 5/2010 | Liu et al. |
| 2010/0167533 A1 | 7/2010 | Lim et al. |
| 2011/0020955 A1* | 1/2011 | DeYoung ............... H01L 21/02126 438/4 |
| 2011/0081782 A1 | 4/2011 | Liang et al. |
| 2011/0151678 A1 | 6/2011 | Ashtiani et al. |
| 2012/0149213 A1 | 6/2012 | Nittala et al. |
| 2012/0161405 A1 | 6/2012 | Mohn et al. |
| 2012/0164328 A1 | 6/2012 | Kojima et al. |
| 2012/0213940 A1 | 8/2012 | Mallick |
| 2013/0122718 A1 | 5/2013 | Kato et al. |
| 2013/0230987 A1 | 9/2013 | Draeger et al. |
| 2014/0004717 A1 | 1/2014 | Chan et al. |
| 2014/0017904 A1 | 1/2014 | Gauri et al. |
| 2014/0106083 A1 | 4/2014 | Wu et al. |
| 2014/0150647 A1 | 6/2014 | Ahn et al. |
| 2014/0302689 A1 | 10/2014 | Ashtiani et al. |
| 2015/0004806 A1 | 1/2015 | Ndiege et al. |
| 2015/0044882 A1 | 2/2015 | Draeger et al. |
| 2015/0118862 A1 | 4/2015 | Reilly et al. |
| 2015/0118863 A1 | 4/2015 | Rathod et al. |
| 2016/0056071 A1 | 2/2016 | Draeger et al. |
| 2016/0111288 A1 | 4/2016 | Antonelli et al. |
| 2017/0137943 A1 | 5/2017 | Mohn et al. |
| 2017/0140931 A1 | 5/2017 | Van Cleemput et al. |

FOREIGN PATENT DOCUMENTS

| | | |
|---|---|---|
| CN | 1815709 A | 8/2006 |
| CN | 101079391 A | 11/2007 |
| EP | 1 063 692 A1 | 12/2000 |
| EP | 0 819 780 B1 | 2/2004 |
| JP | 2001-148382 | 5/2001 |
| JP | 2010-153859 | 7/2010 |
| KR | 10-2006-0005476 A | 1/2006 |
| KR | 10-2007-0104591 A | 10/2007 |
| KR | 10-2009-0040867 A | 4/2009 |
| TW | 380286 | 1/2000 |
| WO | WO 99/22043 A1 | 5/1999 |
| WO | WO 03/021642 | 3/2003 |
| WO | WO 2007/140376 | 12/2007 |
| WO | WO 2007/140424 | 12/2007 |
| WO | WO 2011/072143 | 6/2011 |

OTHER PUBLICATIONS

U.S. Appl. No. 13/461,287, filed May 1, 2012, entitled "CVD Flowable Gap Fill".
U.S. Appl. No. 12/986,070, filed Jan. 6, 2011, entitled "Density Gradient-Free Gap Fill".
U.S. Appl. No. 13/607,511, filed Sep. 7, 2012, entitled "Flowable Oxide Deposition Using Rapid Delivery of Process Gases".
U.S. Appl. No. 14/249,272, filed Apr. 9, 2014, entitled "Methods and Apparatus for Dielectric Deposition."
U.S. Appl. No. 14/466,222, filed Aug. 22, 2014, entitled "Flowable Oxide Film With Tunable Wet Etch Rate".
U.S. Office Action, dated Aug. 23, 2005, issued in U.S. Appl. No. 10/810,066.
U.S. Notice of Allowance and Fee Due, dated Feb. 15, 2006, issued in U.S. Appl. No. 10/810,066.
U.S. Office Action, dated Jun. 27, 2008, issued in U.S. Appl. No. 11/447,594.
U.S. Notice of Allowance and Fee Due, dated Dec. 11, 2008, issued in U.S. Appl. No. 11/447,594.
U.S. Office Action, dated May 24, 2010, issued in U.S. Appl. No. 12/411,243.
U.S. Final Office Action, dated Sep. 13, 2010, issued in U.S. Appl. No. 12/411,243.
U.S. Notice of Allowance, dated Oct. 6, 2010, issued in U.S. Appl. No. 12/411,243.
U.S. Office Action, dated May 18, 2012, issued in U.S. Appl. No. 12/984,524.
U.S. Final Office Action, dated Sep. 14, 2012, issued in U.S. Appl. No. 12/984,524.
U.S. Notice of Allowance, dated Mar. 7, 2013, issued in U.S. Appl. No. 12/984,524.
U.S. Office Action, dated Dec. 16, 2013, issued in U.S. Appl. No. 13/935,398.
U.S. Notice of Allowance, dated Apr. 11, 2014, issued in U.S. Appl. No. 13/935,398.
U.S. Office Action, dated Oct. 26, 2007, issued in U.S. Appl. No. 11/323,812.
U.S. Final Office Action, dated Apr. 9, 2008, issued in U.S. Appl. No. 11/323,812.

(56) References Cited

OTHER PUBLICATIONS

U.S. Office Action, dated Oct. 9, 2008, issued in U.S. Appl. No. 11/323,812.
U.S. Notice of Allowance and Fee Due, dated Apr. 23, 2009, issued in U.S. Appl. No. 11/323,812.
U.S. Notice of Allowance, dated Nov. 18, 2010, issued in U.S. Appl. No. 12/508,461.
U.S. Notice of Allowance, dated Aug. 6, 2012, issued in U.S. Appl. No. 13/031,077.
U.S. Notice of Allowance, dated Jul. 8, 2013, issued in U.S. Appl. No. 13/031,077.
U.S. Office Action, dated Nov. 4, 2008, issued in U.S. Appl. No. 11/925,514.
U.S. Final Office Action, dated Jun. 17, 2009, issued in U.S. Appl. No. 11/925,514.
U.S. Notice of Allowance, dated Jul. 29, 2009, issued in U.S. Appl. No. 11/925,514.
U.S. Office Action, dated Apr. 26, 2011, issued in U.S. Appl. No. 12/625,468.
U.S. Final Office Action, dated Oct. 14, 2011, issued in U.S. Appl. No. 12/625,468.
U.S. Notice of Allowance, dated Jan. 31, 2012, issued in U.S. Appl. No. 12/625,468.
U.S. Office Action, dated Aug. 15, 2013, issued in U.S. Appl. No. 13/461,287.
U.S. Office Action, dated Feb. 28, 2014, issued in U.S. Appl. No. 13/461,287.
U.S. Final Office Action, dated Aug. 26, 2014, issued in U.S. Appl. No. 13/461,287.
U.S. Office Action, dated Nov. 12, 2008, issued in U.S. Appl. No. 11/834,581.
U.S. Final Office Action, dated Aug. 6, 2009, issued in U.S. Appl. No. 11/834,581.
U.S. Office Action dated Dec. 18, 2009, issued in U.S. Appl. No. 11/834,581.
U.S. Final Office Action, dated Apr. 22, 2010, issued in U.S. Appl. No. 11/834,581.
U.S. Notice of Allowance, dated Oct. 7, 2010, issued in U.S. Appl. No. 11/834,581.
U.S. Office Action, dated Nov. 25, 2011, issued in U.S. Appl. No. 12/986,070.
U.S. Final Office Action, dated Jun. 25, 2012, issued in U.S. Appl. No. 12/986,070.
U.S. Office Action, dated Feb. 26, 2010, issued in U.S. Appl. No. 12/334,726.
U.S. Final Office Action, dated Oct. 26, 2010, issued in U.S. Appl. No. 12/334,726.
U.S. Office Action, dated Sep. 16, 2011, issued in U.S. Appl. No. 12/334,726.
U.S. Final Office Action, dated Mar. 30, 2012, issued in U.S. Appl. No. 12/334,726.
U.S. Final Office Action, dated Oct. 23, 2012, issued in U.S. Appl. No. 12/334,726.
U.S. Notice of Allowance dated Jun. 10, 2013, issued in U.S. Appl. No. 12/334,726.
U.S. Notice of Allowance, dated May 29, 2012, issued in U.S. Appl. No. 12/566,085.
U.S. Notice of Allowance, dated Jun. 21, 2012, issued in U.S. Appl. No. 12/566,085.
U.S. Office Action, dated Jun. 21, 2013, issued in U.S. Appl. No. 13/607,511.
U.S. Final Office Action, dated Dec. 11, 2013, issued in U.S. Appl. No. 13/607,511.
U.S. Office Action, dated Jul. 25, 2014, issued in U.S. Appl. No. 13/607,511.
U.S. Office Action, dated Dec. 21, 2012, issued in U.S. Appl. No. 12/964,110.
U.S. Final Office Action, dated Sep. 12, 2013, issued in U.S. Appl. No. 12/694,110.
U.S. Notice of Allowance, dated Dec. 27, 2013, issued in U.S. Appl. No. 12/964,110.
U.S. Notice of Allowance, dated Apr. 23, 2014, issued in U.S. Appl. No. 12/964,110.
U.S. Office Action, dated Dec. 6, 2012, issued in U.S. Appl. No. 13/315,123.
U.S. Office Action, dated Jul. 15, 2013, issued in U.S. Appl. No. 13/315,123.
U.S. Notice of Allowance, dated Nov. 8, 2013, issued in U.S. Appl. No. 13/315,123.
U.S. Office Action, dated Nov. 8, 2013, issued in U.S. Appl. No. 13/313,735.
U.S. Final Office Action, dated Jul. 29, 2014, issued in U.S. Appl. No. 13/313,735.
U.S. Office Action, dated Sep. 12, 2013, issued in U.S. Appl. No. 13/493,936.
U.S. Final Office Action, dated Feb. 3, 2014, issued in U.S. Appl. No. 13/493,936.
U.S. Notice of Allowance, dated May 22, 2014, issued in U.S. Appl. No. 13/493,936.
Japanese Office Action dated Sep. 17, 2013 issued in JP2009-282737.
Japanese Office Action dated Jun. 3, 2014 issued in JP2009-282737.
PCT International Search Report and Written Opinion dated Aug. 10, 2011 issued in PCT/US2010/059721.
PCT International Preliminary Report on Patentability and Written Opinion dated Jun. 21, 2012 issued in PCT/US2010/059721.
Chinese First Office Action dated Feb. 8, 2014 issued in CN 2010-80055670.3.
Bekiari, V. et al. (1998) "Characterization of Photoluminescence from a Material Made by Interaction of (3-Aminopropyl)triethoxysilane with Acetic Acid," *Langmuir*, 14(13):3459-3461.
Chung, Sung-Woong et al. (Mar. 2004) "Flowable Oxide CVD Process for Shallow Trench Isolation in Silicon Semiconductor," *Journal of Semiconductor Technology and Science*, 4(1):45-51.
Brankova et al. (2003) "Photoluminescence from Sol-Gel Organic/Inorganic Hybrid Gels Obtained through Carboxylic Acid Solvolysis," *Chem. Mater.*, 15(9):1855-1859.
Chung, Sung-Woong, et al. (2002) "Novel Shallow Trench Isolation Process Using Flowable Oxide CVD for sub-100nm DRAM," *IEEE, IEDM*, pp. 233-236.
Fessenden et al. (1961) "The Chemistry of Silicon-Nitrogen Compounds," *Chem. Rev.* 61(4)361-388.
Hatanaka, M., et al. (1991) "$H_2O$-TEOS Plasma-CVD Realizing Dielectrics Having a Smooth Surface," *IEEE*, VMIC Conference, pp. 435-441.
Kessler et al. (2006) "New insight in the role of modifying ligands in the sol-gel processing of metal alkoxide precursors: A possibility to approach new classes of materials," *J. Sol-Gel Sci. Techn.* 40(2-3):163-179.
Matsuura, M., et al. (1994) "Novel Self-Planarizing CVD Oxide for Interlayer Dielectric Applications," *IEEE*, pp. 117-120.
Nakano, M., et al. (1989) "Digital CVD of $SiO_2$," *Extended Abstracts of the 21$^{st}$ Conference on Solid State Devices and Materials*, Tokyo, pp. 49-52.
Noguchi, S. et al. (1987) "Liquid Phase Oxidation Employing O Atoms Produced by Microwave Discharge and $Si(CH_3)_4$," *Extended Abstracts of the 19$^{th}$ Conference on Solid State Devices and Materials*, Tokyo, pp. 451-454.
Sakaue, H., et al. (1990) "Digital Chemical Vapor Deposition of $SiO_2$ Using a Repetitive Reaction of Triethylsilane /Hydrogen and Oxidation," *Department of Electrical Engineering*, Hiroshima University, pp. L 124-L 127.
Stathatos et al. (Jul. 19, 2003) "Study of Acetic Acid-Catalyzed Nanocomposite Organic/Inorganic Ureasil Sol-Gel Ionic Conductors," Langmuir, 19:(18)7587-7591.
U.S. Appl. No. 14/519,400, filed Oct. 21, 2014, entitled "Treatment for Flowable Dielectric Deposition on Substrate Surfaces."
U.S. Appl. No. 14/519,712, filed Oct. 21, 2014, entitled "Methods and Apparatus for Forming Flowable Dielectric Films Having Low Porosity."

(56) References Cited

OTHER PUBLICATIONS

U.S. Office Action, dated Oct. 10, 2014, issued in U.S. Appl. No. 13/313,735.
U.S. Appl. No. 14/942,703, filed Nov. 16, 2015, entitled "Apparatus for UV Flowable Dielectric."
U.S. Appl. No. 14/942,704, filed Nov. 16, 2015, entitled "Low K Dielectric Deposition Via UV Driven Photopolymerization."
U.S. Office Action, dated Jan. 20, 2016, issued in U.S. Appl. No. 14/519,400.
U.S. Office Action, dated Jan. 21, 2016, issued in U.S. Appl. No. 14/519,712.
U.S. Office Action, dated Mar. 25, 2015, issued in U.S. Appl. No. 14/464,196.
U.S. Notice of Allowance, dated Sep. 14, 2015, issued in U.S. Appl. No. 14/464,196.
U.S. Notice of Allowance, dated Apr. 20, 2015, issued in U.S. Appl. No. 13/461,287.
U.S. Notice of Allowance, dated Sep. 10, 2015, issued in U.S. Appl. No. 13/461,287.
U.S. Notice of Allowance [Corrected Notice of Allowability], dated Oct. 22, 2015, issued in U.S. Appl. No. 13/461,287.
U.S. Notice of Allowance [Corrected Notice of Allowability], dated Jan. 11, 2016, issued in U.S. Appl. No. 13/461,287.
U.S. Notice of Allowance, dated Jan. 23, 2015, issued in U.S. Appl. No. 13/607,511.
U.S. Office Action, dated Apr. 20, 2015, issued in U.S. Appl. No. 13/313,735.
U.S. Office Action, dated Oct. 22, 2015, issued in U.S. Appl. No. 13/313,735.
U.S. Final Office Action, dated Feb. 19, 2016, issued in U.S. Appl. No. 13/313,735.
U.S. Office Action, dated Dec. 9, 2014, issued in U.S. Appl. No. 14/466,222.
U.S. Final Office Action, dated Jul. 14, 2015, issued in U.S. Appl. No. 14/466,222.
U.S. Notice of Allowance, dated Oct. 23, 2015, issued in U.S. Appl. No. 14/466,222.
Korean Office Action dated Dec. 27, 2015 issued in KR 10-2009-0124466.
Chinese Second Office Action dated Dec. 15, 2014 issued in CN 2010-80055670.3.
Chinese Third Office Action and Search Report dated Jun. 23, 2015 issued in CN 2010-80055670.3.
Chinese Fourth Office Action dated Mar. 14, 2016 issued in CN 2010-80055670.3.
Taiwan Office Action dated Jun. 12, 2015 issued in TW 099143081.
Taiwan Office Action dated Dec. 10, 2015 issued in TW 099143081.
Chinese First Office Action and Search Report dated Dec. 18, 2014 issued in CN 201110424193.X.
Chinese Second Office Action and Search Report dated Sep. 14, 2015 issued in CN 201110424193.X.
Chinese First Office Action and Search Report dated Jan. 6, 2015 issued in CN 201110442926.2.
Chinese Second Office Action and Search Report dated Aug. 25, 2015 issued in CN 201110442926.2.
Taiwan Office Action dated Nov. 20, 2015 issued in TW 100147521.
U.S. Office Action, dated Jan. 15, 2016, issued in U.S. Appl. No. 14/517,732.
U.S. Final Office Action dated May 13, 2016 issued in U.S. Appl. No. 14/517,732.
U.S. Notice of Allowance dated Jul. 26, 2016 issued in U.S. Appl. No. 14/517,732.
U.S. Final Office Action, dated Jul. 29, 2016, issued in U.S. Appl. No. 14/519,400.
U.S. Final Office Action, dated Jul. 29, 2016, issued in U.S. Appl. No. 14/519,712.
U.S. Office Action, dated May 6, 2016, issued in U.S. Appl. No. 14/942,704.
U.S. Final Office Action, dated Oct. 19, 2016, issued in U.S. Appl. No. 14/942,704.
U.S. Office Action, dated Jun. 24, 2016, issued in U.S. Appl. No. 14/249,272.
U.S. Office Action, dated Jul. 29, 2016, issued in U.S. Appl. No. 13/329,078.
Korean Office Action dated Jul. 12, 2016 issued in KR 10-2009-0124466.
Taiwan Office Action dated Apr. 20, 2016 issued in TW 100145389.
Weast, (1975) "CRC Handbook of Chemistry and Physics," 56th edition, CRC Press, Cleveland, Ohio, excerpts from F-95 & F-119, 4 pages.
Grill et al. (Nov. 15, 2003) "Structure of low dielectric constant to extreme low dielectric constant SiCOH films: Fourier transform infrared spectroscopy charaterization," Journal of Applied Physics, 94(10):6697-6707.
U.S. Office Action, dated Mar. 27, 2017, issued in U.S. Appl. No. 14/519,400.
U.S. Notice of Allowance, dated Aug. 15, 2017, issued in U.S. Appl. No. 14/519,400.
U.S. Office Action, dated May 4, 2017, issued in U.S. Appl. No. 14/519,712.
U.S. Notice of Allowance, dated Mar. 22, 2017, issued in U.S. Appl. No. 13/329,078.
Korean Office Action dated Nov. 1, 2016 issued in KR 10-2012-7013775.
Taiwan Office Action and Search Report dated Nov. 16, 2016 issued in TW 102107721.
Chinese Office Action dated Dec. 13, 2017 issued in CN 2017120801752910.

* cited by examiner

METHOD FOR SELECTIVELY SEALING ULTRA LOW-K POROUS DIELECTRIC LAYER USING FLOWABLE DIELECTRIC FILM FORMED FROM VAPOR PHASE DIELECTRIC PRECURSOR

BACKGROUND

As integrated circuits (IC) feature sizes shrink, problems of increased resistance and resistance-capacitance (RC) coupling offset any speed advantage derived from the smaller device size, limiting improvement in device performance. Ways to improve device performance and reliability include using highly conductive metals, such as copper, and employing lower dielectric constant (low-k) materials.

Low-k materials are semiconductor-grade insulating materials that have a dielectric constant ("k") lower than that of silicon dioxide $SiO_2$, i.e., 3.9. With more and more advanced technology needs, ultra low-k dielectric (ULK) materials having a k less than 2.5 are used. ULK dielectrics can be obtained by incorporating or creating voids within a low-k dielectric, creating a porous dielectric material. Applications of ULK dielectrics include back end of line (BEOL) interlayer dielectrics (ILDs).

SUMMARY

One aspect of the subject matter disclosed herein may be implemented in a method of sealing pores in a porous dielectric layer. The porous dielectric layer may have an external surface and pores open to the external surface. The method may involve introducing a vapor phase dielectric precursor into a process chamber with the partial pressure of the dielectric precursor below the saturation pressure of the dielectric precursor to thereby selectively deposit a flowable dielectric film in at least the opening of the pores of the porous dielectric layer. The flowable dielectric film may be deposited by capillary condensation in the pores.

In some embodiments, the porous dielectric layer includes a recessed region formed therein, such that the external surface includes a surface of the recessed region. Examples of recessed regions include vias and trenches formed in the dielectric. Pores recessed from the recess region surface are sealed by the deposited flowable dielectric film. Deposition of the flowable dielectric film may be performed without substantial deposition in the recessed region. The bottom of the recessed region includes an exposed metal, metal nitride or metal oxide surface in certain embodiments. In such embodiments, deposition of the flowable dielectric film may be performed without deposition on the metal, metal nitride, or metal oxide surface.

In some embodiments, the method further involves forming a metal-containing layer on the recessed region surface. In some embodiments, the recessed region may be filled with a metal.

Examples of flowable dielectric films include doped or undoped silicon oxide, carbon-doped silicon oxide, silicon oxynitride, and silicon nitride materials. In some embodiments, the method involves introducing an oxidant to the process chamber. In some implementations, the method involves introducing a nitrogen-containing co-reactant to the process chamber. Examples of dielectric precursors include alkloxysilanes, alkylsilanes, and aminosilanes. In some embodiments, the porous dielectric layer to the dielectric precursor to thereby replace bonds in the porous dielectric layer.

Another aspect of the subject matter disclosed herein may be implemented in a method including providing a porous interlayer dielectric (ILD) layer having a recessed region formed therein exposing a metal surface; introducing a vapor phase dielectric precursor below the saturation pressure of the vapor phase dielectric precursor to selectively condense the dielectric precursor in at least the opening of the pores of the porous ILD layer; forming a metal-containing barrier layer in the recessed region; and filling the trench with a conductive material.

Another aspect of the subject matter disclosed herein may be implemented apparatus including a flowable dielectric deposition chamber configured to deposit flowable dielectric film on a workpiece provided therein; and a controller, said controller comprising instructions for maintaining a workpiece temperature of between −20° C. and 100° C. and introducing a dielectric precursor and a co-reactant into the deposition chamber for a time period of 5 seconds or less to thereby selectively deposit a flowable dielectric film in pores of the workpiece. The controller may further comprise instructions to introduce the dielectric precursor below the saturation pressure of the vapor phase dielectric precursor.

These and other aspects are described further below with reference to the drawings.

DETAILED DESCRIPTION

Figure 1:
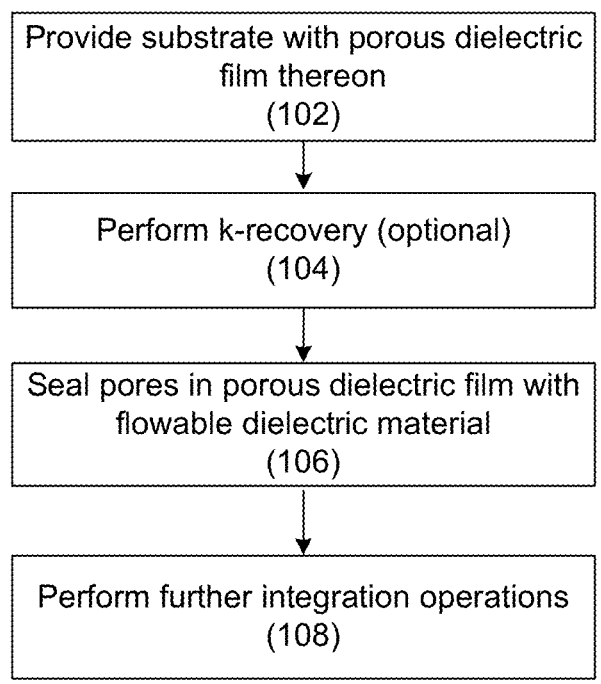
FIG. 1 is a process flow chart depicting an example of a method of sealing pores in a porous dielectric.

Implementations of the disclosure are described herein in the context of pore sealing of a porous ultra low-k (ULK) film in back end of line (BEOL) processing of semiconductor devices. Those skilled in the art will realize that the following detailed description is illustrative only and is not intended to be in any way limiting. Other embodiments of the disclosure will readily suggest themselves to such skilled persons having the benefit of this disclosure. For example, sealing of any porous film, including porous non-dielectric films, may be implemented using the methods and apparatus disclosed herein. Further, the methods and apparatus may find applications in front end of line (FEOL) processing of semiconductor devices, or in fabrication of other types of devices including display devices and the like.

The term "semiconductor device" as used herein refers to any device formed on a semiconductor substrate or any device possessing a semiconductor material. In many cases, a semiconductor device participates in electronic logic or memory, or in energy conversion. The term "semiconductor device" subsumes partially fabricated devices (such as partially fabricated integrated circuits) as well as completed devices available for sale or installed in particular apparatus. In short, a semiconductor device may exist at any state of manufacture that employs a method of the subject matter disclosed herein or possesses a structure of this subject matter disclosed herein.

Implementations of the methods and apparatus disclosed herein relate to pore sealing of porous dielectric films using flowable dielectric material. The methods involve exposing a substrate having an exposed porous dielectric film thereon to a dielectric precursor under conditions such that a flowable dielectric material preferentially deposits in the pores of the porous dielectric material. The pores can be filled with the deposited flowable dielectric material without depositing a continuous film on the surface of the porous dielectric film or on any exposed metal surfaces.

Implementations of the methods and apparatus described herein may have various advantages. For example, the methods may have good selectivity for deposition inside the pores over outside the pores, and, if deposited, for blanket films on the sealed porous dielectric over a metal surface. This allows pore sealing without deposition on or modification of exposed Cu, Co or other metal surfaces that would lead to an unacceptable increase in contact resistance. In some implementations, the pores may be sealed without a continuous modified layer on the porous dielectric surface that could lead to unacceptable k-shift and resistive-capacitive (RC) delay. The methods also allow pore sealing without damage to the near surface of the porous dielectric. Such intentional damage, while able to block pores, can cause an unacceptable k-shift.

Vapor-phase reactants are introduced to a deposition chamber to deposit the flowable dielectric films. As-deposited, the flowable dielectric films generally have flow characteristics that can provide consistent fill of at least the opening of a pore. The term "as-deposited flowable dielectric film" refers to a flowable dielectric film prior to any post-deposition treatments, densification, cure or anneal. An as-deposited flowable dielectric film may be characterized as a soft jelly-like film, a gel, a sol, or a flowable film. In some embodiments, the as-deposited film is a solid, non-liquid film that is liquid and flowable only during the deposition process. As soon as the deposition process stops, it is a solid film.

The flowable dielectric deposition methods described herein are not limited to a particular reaction mechanism; the reaction mechanism may involve an adsorption reaction, a hydrolysis reaction, a condensation reaction, a polymerization reaction, a vapor-phase reaction producing a vapor-phase product that condenses, condensation of one or more of the reactants prior to reaction, or a combination of these. The term "flowable dielectric film" can include any dielectric film that is formed from vapor-phase reactants and is flowable during deposition, including films that have been reacted, dried or treated such that they are no longer flowable.

FIG. 1 is a process flow chart depicting operations in an example of a method according to an implementation of the disclosure. A substrate having a porous dielectric film thereon is provided at block 102. The porous dielectric film may be for example, a ULK film, having a dielectric constant of 2.4 or less. Examples of ULK films include carbon doped oxide (CDO) films, zeolite films, and polymer films.

The porosity of the dielectric film may be connected, and may include pores that are introduced by removal of a porogen from a dielectric matrix and/or pores that are inherent to the dielectric matrix. For example, a CDO matrix may have porosity due the incorporation of methyl or other organic groups. The porous dielectric film may include mesoporosity and/or microporosity. Mesoporosity generally refers to pore sizes of 2 nm-50 nm and microporosity to pore sizes less than 2 nm. In dielectrics having connected porosity, the size of at least some of the connected pores may be on a continuum with micropores having sizes on the order of Angstroms to nanometers, connected to mesopores having sizes on the order of nanometers to tens of nanometers. Although the methods may also be used to seal unconnected pores and provided smooth deposition surfaces, particular use may be found in sealing connected pores that left unsealed provide a diffusion pathway through a film.

The porous dielectric film provided in block 102 may be an etched porous dielectric film, for example an etched inter-layer dielectric (ILD) layer. Porosity characteristics at the exposed surface may depend on the etch process as well as on the particular film and method of deposition.

Figure 2A:
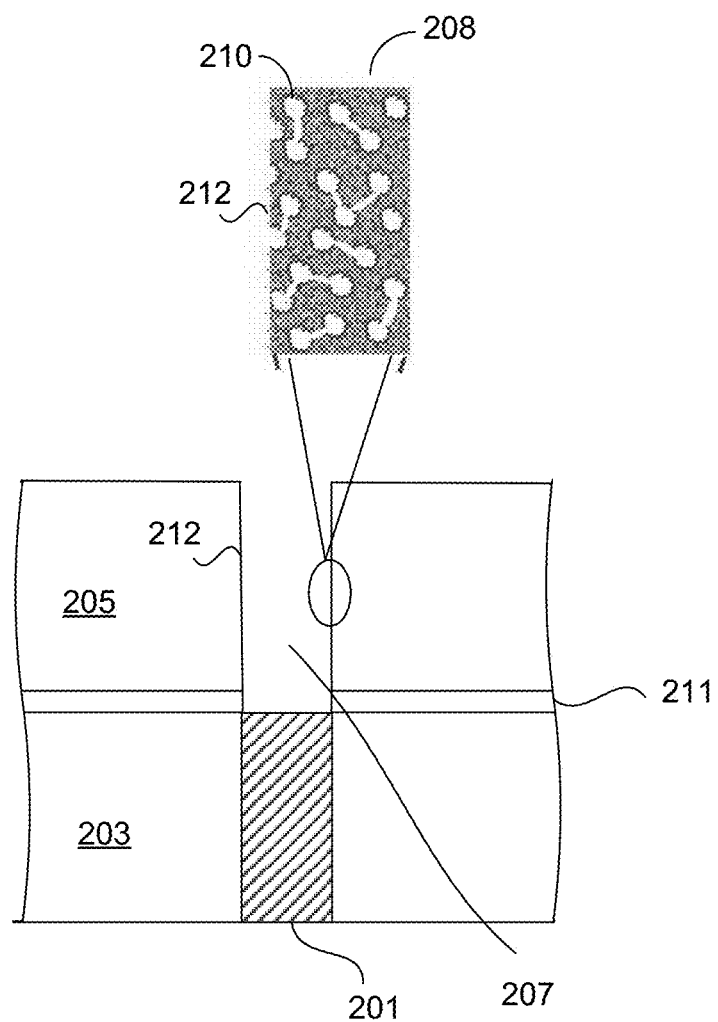
FIGS. 2A-2D are cross sectional diagrams illustrating stages in an example of pore sealing in an back end of line (BEOL) process.

FIG. 2A shows an example of a structure including an embedded metal line 201 in a first dielectric layer 203. An etched porous dielectric layer 205 overlies the first dielectric layer 203 and, optionally an etch stop layer 211 such as a silicon carbide, silicon oxycarbide, silicon nitride, or silicon oxynitride etch stop layer. The etched porous dielectric layer 205 is etched in previous processing to define a recess 207 and expose the metal line 201. An exposed surface 212 of the etched porous dielectric layer 205 includes the surface of the recess 207.

The etched porous dielectric layer 205 is a porous dielectric having connected porosity. An enlarged schematic view of a cross-section of a portion of the etched porous dielectric layer 205 is depicted. The etched second dielectric layer includes pores 210 that are connected (in or out of the plane of the cross-section) and thus exposed at the surface 212 to the ambient conditions.

Figure 3:
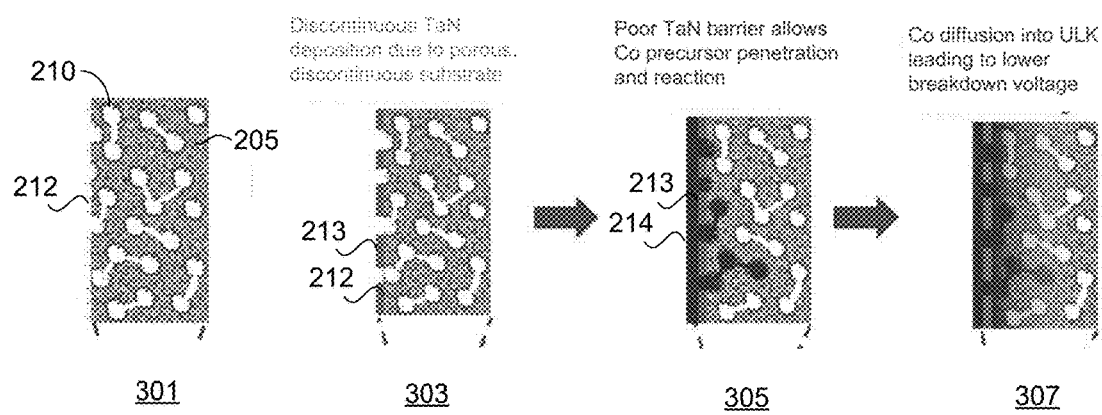
FIG. 3 shows cross-sectional diagrams illustrating an example of a mechanism of metal penetration into an inter-later dielectric (ILD).

Subsequent operations may involve optionally cleaning or treating the surface of the metal line 201, depositing a barrier layer, and filling the recess 207 with a conductive material. If the pores are not sealed, any of these operations may result in precursor and/or metal penetration into the pores 210, which can result in lower break down voltage and failure. FIG. 3 shows one possible integration process that could result in metal penetration into an ILD. First at 301, the enlarged cross-sectional schematic of the etched porous dielectric layer 205 depicted in FIG. 2A is shown. The exposed surface 212 of the etched porous dielectric layer 205 is discontinuous due to the presence of pores 210. At 303, the etched porous dielectric layer 205 includes a physical vapor deposition (PVD) tantalum nitride (TaN) barrier layer 213 is deposited on exposed surface 212. The barrier layer 213 is discontinuous due to the porous, discontinuous surface 212 on which it is formed. If the PVD-deposited TaN layer were deposited to a sufficiently large thickness, it may be continuous and provide adequate protection against subsequent penetration of materials into the pores. However, as feature size decreases, it is less desirable to deposit thick barrier layers. As a result, barrier layer deposition may involve PVD deposition of a relatively thin, discontinuous TaN sub-layer, followed by chemical vapor deposition (CVD) or atomic layer deposition (ALD) of a second barrier sub-layer to form a barrier layer.

In some implementations, a seed layer for subsequent metallization may be deposited by CVD or ALD on the barrier layer. This is illustrated at 305, which shows a CVD-deposited cobalt (Co) seed layer 214 on the TaN barrier layer 213. Because the TaN barrier layer 213 is discontinuous, the Co CVD precursors are able to penetrate the second dielectric film 205 via its connected pores 210. The precursors may react, forming Co and allowing Co diffusion into the etched porous dielectric layer 205. See 307.

In addition to the possible avenue depicted in FIG. 3, precursors and/or metal may penetrate into a porous dielectric material in integration schemes in which barrier layer deposition involves an ALD deposition and/or a CVD deposition, either alone or in addition to a deposition of a discontinuous PVD layer. Further, if the final barrier layer or barrier/seed itself is not sufficiently thick and continuous, subsequent copper or other metal that forms the contact may penetrate into the porous dielectric layer. As discussed further below, implementations of the methods disclosed herein prevent penetration of precursors and metals into the etched porous dielectric layer 205 by sealing the pores. As a result, the methods facilitate thin barrier layer integration schemes without compromising the integrity of the porous dielectric layer.

Returning to FIG. 1, after the porous dielectric layer is provided, an optional k-recovery operation may be performed. Block 104. Examples of low-k recovery operations for carbon-containing dielectric films can include exposure to ultraviolet (UV) radiation and/or to a chemical silylating agent for the repair of process-induced dielectric damage. Low-k recovery operations are discussed in further detail in, for example, U.S. Pat. Nos. 7,851,232 and 8,465,991 and U.S. Patent Publication No. 2011/0111533, all of which are incorporated by reference herein. As discussed further below, in some implementations, block 104 may overlap or be performed simultaneously with the pore sealing operation of block 106.

In block 106, the porous dielectric film is sealed with a flowable dielectric material. Block 106 generally involves deposition of a flowable dielectric film from a vapor-phase dielectric precursor and an optional co-reactant at relatively low temperatures, e.g., −20° C. to 100° C. In some implementations, the deposition involves a capillary condensation reaction mechanism. This is described further below with respect to FIG. 4.

In some implementations, block 106 involves selective deposition of the flowable dielectric material in the pores of the porous dielectric layer. Selective deposition refers to a process that preferentially deposits in a location without or prior to depositing in other locations. In block 106, the flowable dielectric material preferentially deposits inside at least the opening of the pores of the porous dielectric material than outside the pores of the porous dielectric material, for example, on the discontinuous external surface of the porous dielectric and on the exposed metal surfaces. As such, deposition of flowable dielectric material on the porous dielectic surface (e.g., surface 212 in FIG. 2A) and on other exposed surfaces such the surface of metal line 201 in FIG. 2A may be non-existent or substantially non-existent, with one of ordinary skill in the art understanding that there may be some small areas of film nucleating on these surfaces.

According to various implementations, block 106 may have one or both of the following aspects of selectivity: 1) it may involve a mechanism that deposits preferentially in the smallest features such that it fills pores or the small openings of pores in the porous dielectric without or prior to forming a continuous film on the surface of the porous dielectric or exposed metal, and 2) it has a shorter nucleation delay on dielectric surfaces compared to the metal surfaces such that it at least partially fills pores in the porous dielectric without or prior to forming a continuous film on the metal surfaces. Aspect (2) allows a time window for selective deposition even for blanket films.

In some implementations, block 106 exploits a thermodynamic effect in which a flowable dielectric material remains selectively condensed in the pores, as the smallest spaces available for formation of the flowable dielectric material. As such the flowable dielectric material is selectively deposited in the pores. In some implementations the smallest space available is the openings to the pores such that flowable dielectric material is deposited in the openings but does not completely fill the pores. (In some implementations, the thermodynamic effect can be exploited to evaporate flowable dielectric material deposited outside the pores, while the flowable material in the pores remains condensed.) After selective deposition in the pores, the flowable dielectric material can be physically and/or chemically converted to a solid dielectric material. The conversion may or may not be facilitated by a post-deposition treatment according to various implementations. In some implementations, the flowable dielectric film undergoes a post-deposition treatment to physically or chemically modify the film. Such an operation may be performed while the film is still in a flowable state and/or after it is no longer in a flowable state.

In some implementations, block 106 involves provided a precursor in a vapor phase at a partial pressure below its saturation pressure. The preference for liquid to remain condensed in the small spaces (i.e., capillary condensation) at pressures below the saturation pressure allows for selective deposition in pores. In some embodiments, the partial pressure may be gradually increased until it approaches point the material begins to condense as a liquid in the pores, or the precursor may be introduced at this pressure. Further, in some implementations, partial pressure of the precursor may be set or increased to allow a thin blanket layer to deposit outside the pores on the external surface of the porous dielectric layer.

The pore sealing operation in block 106 penetrates into the pores without completely filling the interconnected pores. As such, it is distinct from depositions that may have completely fill all of the interconnected pores, and depositions that just seal the exposed surface without penetrating in to the pores. At a minimum, the opening of the pores exposed on the surface may be filled. In addition, there also may be partial penetration beyond the opening. However, the open interconnected pores are not completely filled, as that would lead to significant k value increase.

Sealing the porous dielectric refers to preventing diffusion or penetration of metal atoms into the porous dielectric. Smaller species (e.g., H radicals) may be able to penetrate a sealed pore, however.

Figure 2B:
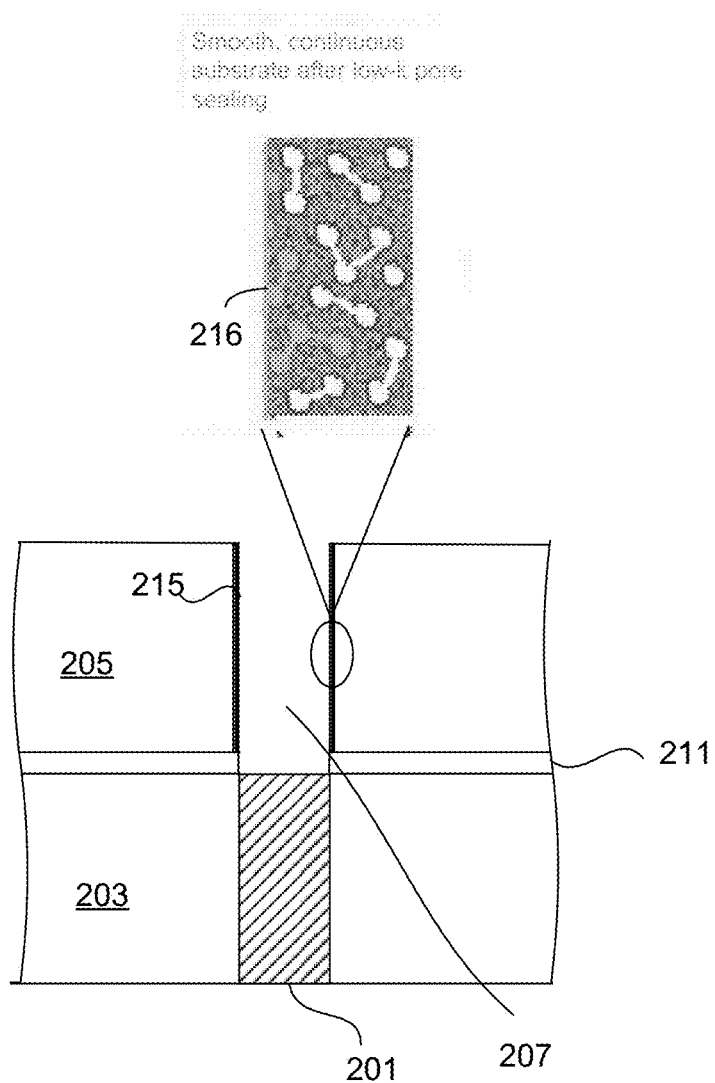

FIG. 2B shows the structure depicted in FIG. 2A after a pore sealing operation. A portion 215 of the etched porous dielectric layer 205 includes sealant material 216 deposited by a flowable dielectric deposition process. An enlarged schematic view of a cross-section of a portion of the sealed etched porous dielectric layer 205 is depicted. Pores 210 that were previously open to the ambient are sealed with the sealant material 216 deposited from the flowable dielectric deposition process. Depending on whether or not the field regions of the etched porous dielectric layer 205 are capped or not with another material (e.g., such an etch stop or hard mask layer), pores open to the field region may also be sealed in addition to the pores open to the recess 207.

Returning to FIG. 1, once the pores are sealed, further integration operations may be performed. Block 108. These can include barrier layer deposition, chemical mechanical planarization (CMP), and metallization, e.g., with copper. As discussed above, barrier layer deposition may involve CVD and/or ALD depositions on the dielectric material or on a PVD-deposited discontinuous layer in some embodiments. Examples of materials for barrier layers include tantalum (Ta), tantalum nitride (TaN), titanium nitride (TiN), and Co. If copper is used to fill the feature, a copper seed layer may be deposited to promote film growth during electrochemical plating process. If another metal is used, a seed layer may or may not be used. CMP may be used to from an exposed pattern of conductive features in the porous dielectric layer.

Figure 2C:
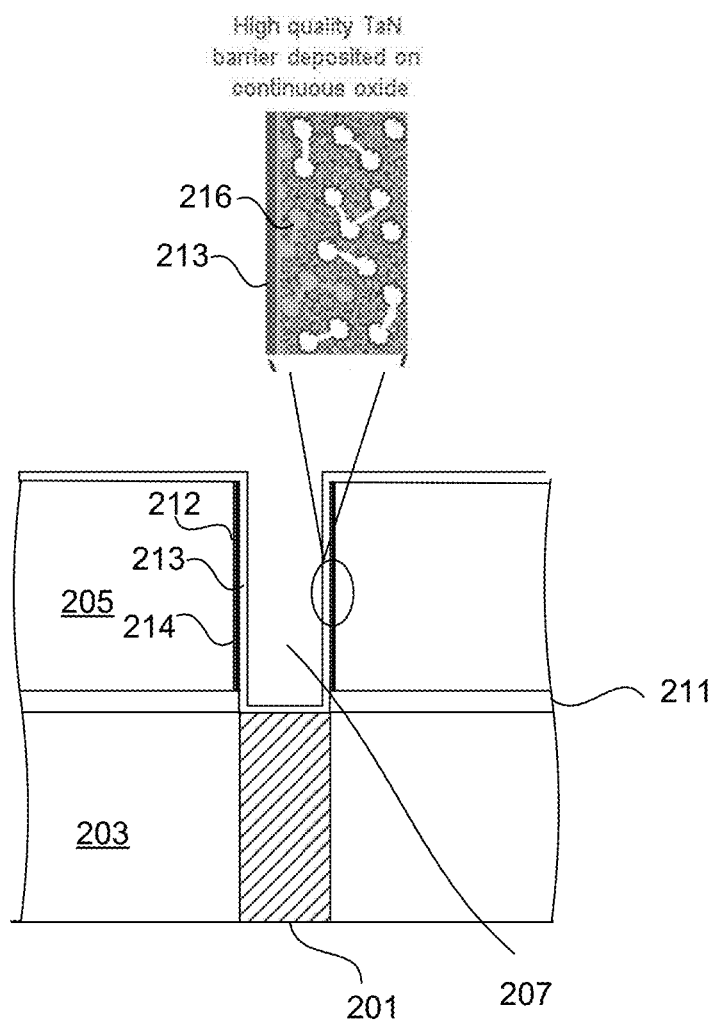
Figure 2D:
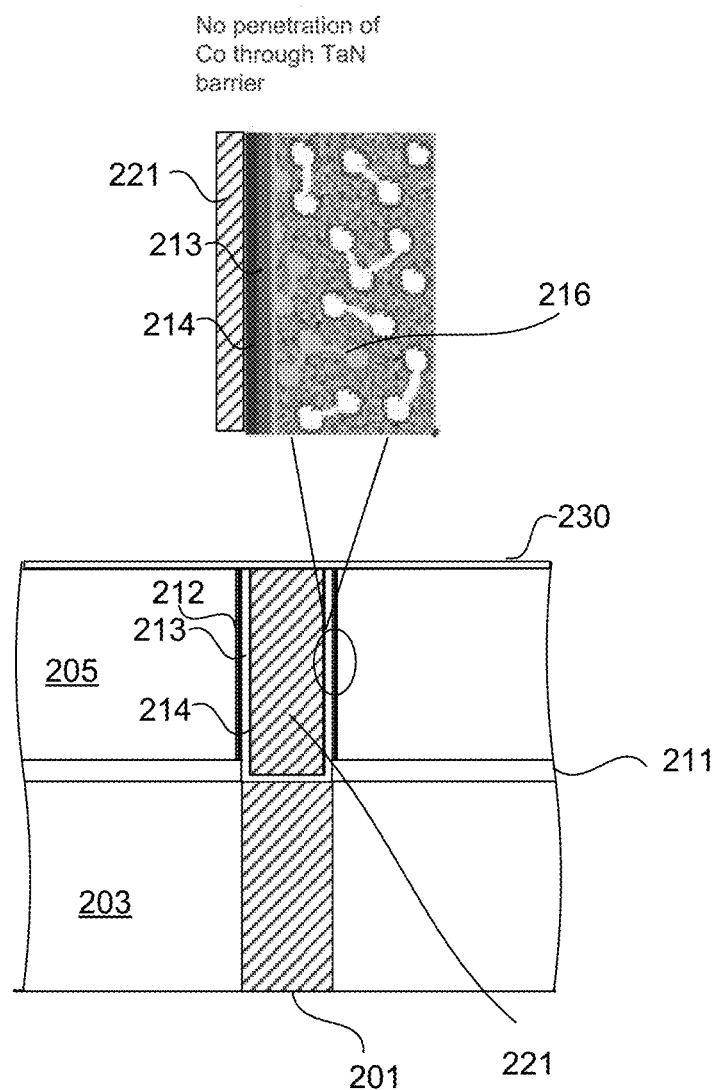

FIG. 2C shows the structure depicted in FIG. 2B after deposition of barrier layer 213. The barrier layer 213 is continuous due to be deposited on a smooth continuous surface formed the sealant material 216 alone or, if the sealant material 216 does not form a continuous film on the surface 212 of the second dielectric layer 205, with the surface 212. FIG. 2D shows the structure depicted in FIG. 2C after deposition of Co seed layer 214, copper filling 221, CMP, and capping with a dielectric capping layer such as silicon carbide (SiC) layer 230.

The process of FIG. 1 may be repeated with additional layers of porous dielectric material to attain the desired levels of metal features in the device. It should be noted that the foregoing description is just an example of a process with which the methods may be implemented. Single or dual damascene processes including via-first and trench-first processes may be performed. The methods are also applicable in essentially any semiconductor processing context where porous dielectric films are used.

Figure 4:
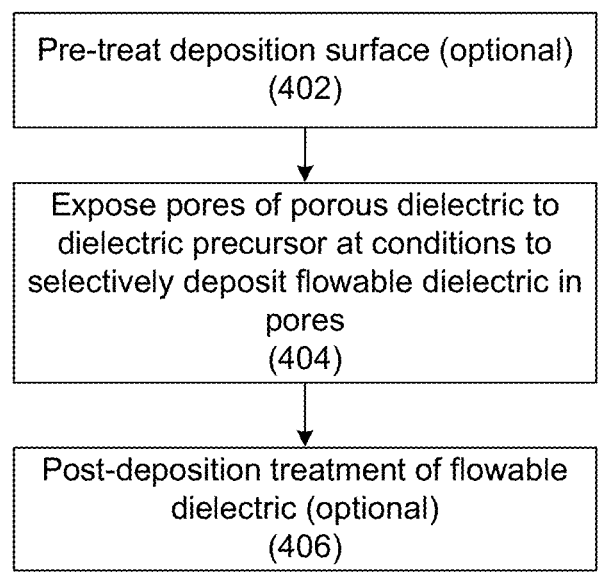
FIG. 4 is a process flow chart depicting a method of sealing pores of porous dielectric according to certain implementations.

FIG. 4 is a process flow chart depicting a method of sealing pores according to certain implementations. First, at 402 an optional pre-treatment of the deposition surface is performed. As discussed above, the sealing process disclosed herein may have one or more of several aspects of selectivity. A pre-treatment process may be used in some implementations to enhance selectivity due to the flowable dielectric material having a shorter nucleation delay on dielectric surfaces compared to the metal surfaces. One or more pre-treatments may be used to control surface termination on substrates to enhance or block subsequent flowable dielectric deposition. In some implementations, a pre-treatment that interacts differently with porous dielectric material that is to be sealed and exposed metal surfaces, if present, is used. In this manner, selectivity of flowable dielectric deposition into pores is increased.

Block 402 may involve exposing the substrate to one or more treatments that enhance deposition in the pores of the porous dielectric and/or block deposition on the exposed metal surfaces. The pre-treatment may depend on the particular surface on which the flowable dielectric material is to be deposited or prevented from depositing. For deposition on silicon nitride and silicon oxide materials, creation of a silanol (Si—OH) termination can provide good wetting for flowable oxide deposition. In some implementations, a porous dielectric film that has undergone a k-recovery process to recover Si—C bonds that were removed during etch, may be pre-treated to change some of the recovered bonds to Si—OH terminations. This can be done by adsorption of —OH terminated self-assembled monolayers, reaction with —OH containing gases such as steam or alcohol, or treatment with reactive oxygen and hydrogen species (e.g., from a downstream plasma).

Pre-treatments to create hydrophilic surfaces to promote wetting (especially for hydrophobic dielectric precursors such as a carbon-containing dielectric precursors) are disclosed in U.S. Provisional Patent Application No. 61/895, 676, incorporated by reference herein. In some implementations, the methods involve exposing the porous dielectric to an oxidizing gas, in some implementations, a hydrogen-containing oxidizing gas. However, for many pore sealing applications, there may be exposed metal surfaces that should not be oxidized. Accordingly, while oxidizing treatments may be used in some implementations to increase the wettability of certain porous materials, they may be avoided in processes such as those depicted in FIGS. 2A-2D in which the metal line 201 is at risk for oxidation. The risk of metal oxidation is reduced with lower temperature and less reactive pre-treatments.

In some implementations, block 402 may involve exposure to a reducing chemistry such as exposure to one of the following gases or plasmas generated therefrom: molecular hydrogen ($H_2$), $H_2$ mixed with nitrogen ($N_2$), ammonia ($NH_3$), hydrazine ($N_2H_2$), and the like. Such a treatment may reduce metal oxides such as copper oxide ($CuO_x$) that may have formed on the metal, thereby making the metal surfaces less hospitable to flowable dielectric deposition.

In some implementations, a nitrogen-containing chemistry such as an ammonia-containing or amine-containing gas or plasma may be used to form a thin metal nitride that can prevent or minimize flowable oxide deposition. The nitride layer, and any flowable oxide deposited on top, may then be removed by a mild thermal treatment or using a weak etch or clean.

Still further, a pre-treatment may involve formation of a layer of bi-functional compounds on the metal surfaces, such as a self-assembled monolayer, the bi-functional compounds including two functional moieties, one that bonds to the metal surface, and one that prevents flowable dielectric deposition. The layer is formed selectively on the metal such that flowable dielectric deposition in the pores of the porous dielectric would be unaffected.

According to various embodiments, a pre-treatment operation may involve exposure to a plasma such as a plasma containing hydrogen, oxygen, fluorine, chlorine, nitrogen, helium, argon species, or some combination of these. The plasma may be downstream or in-situ, generated by a remote plasma generator, such as an Astron® remote plasma source, an inductively-coupled plasma generator or a capacitively-coupled plasma generator. In some implementations, the pre-treatment may avoid in situ plasmas to avoid damaging the porous dielectric layer. In alternate embodiments, the pretreatment operation involves exposing the substrate to the pre-treatment chemistry in a non-plasma environment. The particular process conditions may vary depending on the implementation. In some of these embodiments, the substrate may be exposed to the pre-treatment chemistry in the presence energy from another energy source, including a thermal energy source, a ultra-violet source, a microwave source, etc. In certain embodiments, in addition to or instead of the pre-treatment operations described above, a substrate is pretreated with exposure to a catalyst, surfactant, or adhesion-promoting chemical. A pre-treatment process may also involve exposure to a low-k recovery agent as discussed further below. The pre-treatment operation, if performed, may occur in the deposition chamber or may occur in another chamber prior to transfer of the substrate to the deposition chamber.

Next, the pores of the porous dielectric material are exposed to a process gas including a dielectric precursor and typically (though not necessarily) a co-reactant. Block 404. Depositing a flowable oxide film, for example, can involve exposing the substrate to gaseous reactants including a dielectric precursor and an oxidant such that a condensed flowable film forms in the gap. The deposition generally occurs in non-plasma conditions, though in certain embodiments, plasma-enhanced conditions may be employed. In other embodiments, reactive species from a downstream plasma may be present even though the pores are not directly exposed to a plasma.

Examples of deposition chemistries according to various embodiments are described below; however, the methods are not limited to a particular chemistry. In some embodiments to deposit a silicon oxide film, the dielectric precursor is a silicon-containing compound and the oxidant a compound such as a peroxide, ozone, oxygen, water, etc. In some embodiments, the oxidant is a non-hydroxyl-forming oxidant such as ozone or oxygen. As described further below, the deposition chemistry may include on or more of a solvent and a catalyst as well. In some implementations, a SiCOH film is formed, using for example a dielectric precursor including one or more Si—C bonds. In some implementations, the flowable dielectric film is a silicon and nitrogen-containing film, such as silicon nitride or silicon oxynitride deposited by introducing vapor phase reactants to a deposition chamber at conditions such that they react to form a flowable film. The nitrogen incorporated in the film may come from one or more sources, such as a silicon and nitrogen-containing precursor (for example, trisilylamine (TSA) or disilylamine (DSA)), a nitrogen precursor (for example, ammonia ($NH_3$) or hydrazine ($N_2H_4$)), or a nitrogen-containing gas (for example $N_2$, $NH_3$, NO, $NO_2$, or $N_2O$).

The process gases may be introduced into the reactor simultaneously, or one or more component gases may be introduced prior to the others. U.S. patent application Ser. No. 12/566,085, incorporated by reference herein, provides a description of reactant gas sequences that may be used in accordance with certain embodiments. Block 404 is generally allowed to proceed until the pores are sealed.

As indicated above, block 404 may involve a capillary condensation mechanism in which the flowable dielectric material preferentially deposits in the smallest features, allowing the pores of the porous dielectric film to at least partially fill and seal without (or prior to) depositing a continuous, blanket film on the surface of the porous dielectric or metal. Due to capillary condensation, flowable process reactants can condense in the pores or the openings of the pores even if their partial pressure is below the saturated vapor pressure. This is due to an increased number of van der Waals interactions between vapor phase molecules inside the confined space of capillaries (i.e., the pores). This allows pore sealing without continuous film deposition on surfaces.

In an example of deposition of a flowable oxide, the overall deposition process may be described in context of two steps: hydrolysis and condensation, the latter which is sometimes referred to as polymerization. The first step involves hydrolysis of a silicon-containing precursor by an oxidant. For example, alkoxy groups (—OR) of a silicon-containing precursor may be replaced with hydroxyl groups (—OH). The —OH groups and the residual alkoxy groups participate in condensation reactions that lead to the release of water and alcohol molecules and the formation of Si—O—Si linkages.

In an example of a flowable oxide deposition mechanism to deposit a low-k film, the following reaction may be employed reacting an alkoxysilane dielectric precursor R'—Si(OR)$_3$ where R' and R are organic ligands, with R' an organic ligand incorporated in the low-k film to lower the dielectric constant. First, it involves hydrolysis of the dielectric precursor by water:

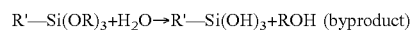

A subsequent condensation and polymerization reaction forms Si—O—Si chains:

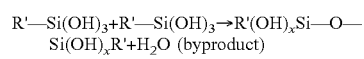

Undoped silica glass (USG) may also be deposited, for example, using a precursor without a Si—C bond.

Examples of other reactions and of reaction mechanisms that may be employed in some implementations to deposit silicon oxides, including SiCOH films, are given in U.S. patent application Ser. No. 14/464,196 titled "LOW-K OXIDE DEPOSITION BY HYDROLYSIS AND CONDENSATION", filed concurrently herewith and incorporated herein by reference.

In certain embodiments, reactant partial pressure is controlled to facilitate capillary condensation and inside-out fill of the pores. Liquid condensation can occur below saturation pressure in small spaces such as the pores; the reactant partial pressure controls the capillary condensation. In certain embodiments, reactant partial pressure is set below the saturation vapor pressure. In a hydrolyzing medium, the silicon-containing precursor forms a fluid-like film on the wafer surface that preferentially deposits in the pores due to capillary condensation and surface tension forces, resulting in an inside-out (e.g., bottom up) fill process.

Block 404 may or may not involve formation of a continuous film on the surface of the porous dielectric film. In implementations in which a continuous film is allowed to form on the surface of the porous dielectric film, it may be done under conditions and for a limited time such that a continuous film does not form on any exposed metal surfaces.

After selective deposition, the deposited flowable dielectric material is optionally treated. Block 406. The as-deposited films can be treated to physically densify and/or chemically convert the as-deposited film to a desired dielectric material. As used herein, the term "densified flowable dielectric film" refers to a flowable dielectric film that has been physically densified and/or chemically converted to increase its density or improve its materials properties. In some embodiments, physically densifying the film can involve shrinking the film; according to various embodiments, a densified flowable dielectric film may or may not be shrunk as compared to the as-deposited dielectric film. In some cases physically densifying the film can involve substituting chemicals in the film, which may result in denser, higher volume films. In some embodiments, the films may undergo a certain amount of densification during the deposition itself.

Figures 5A, 5B, 5C:
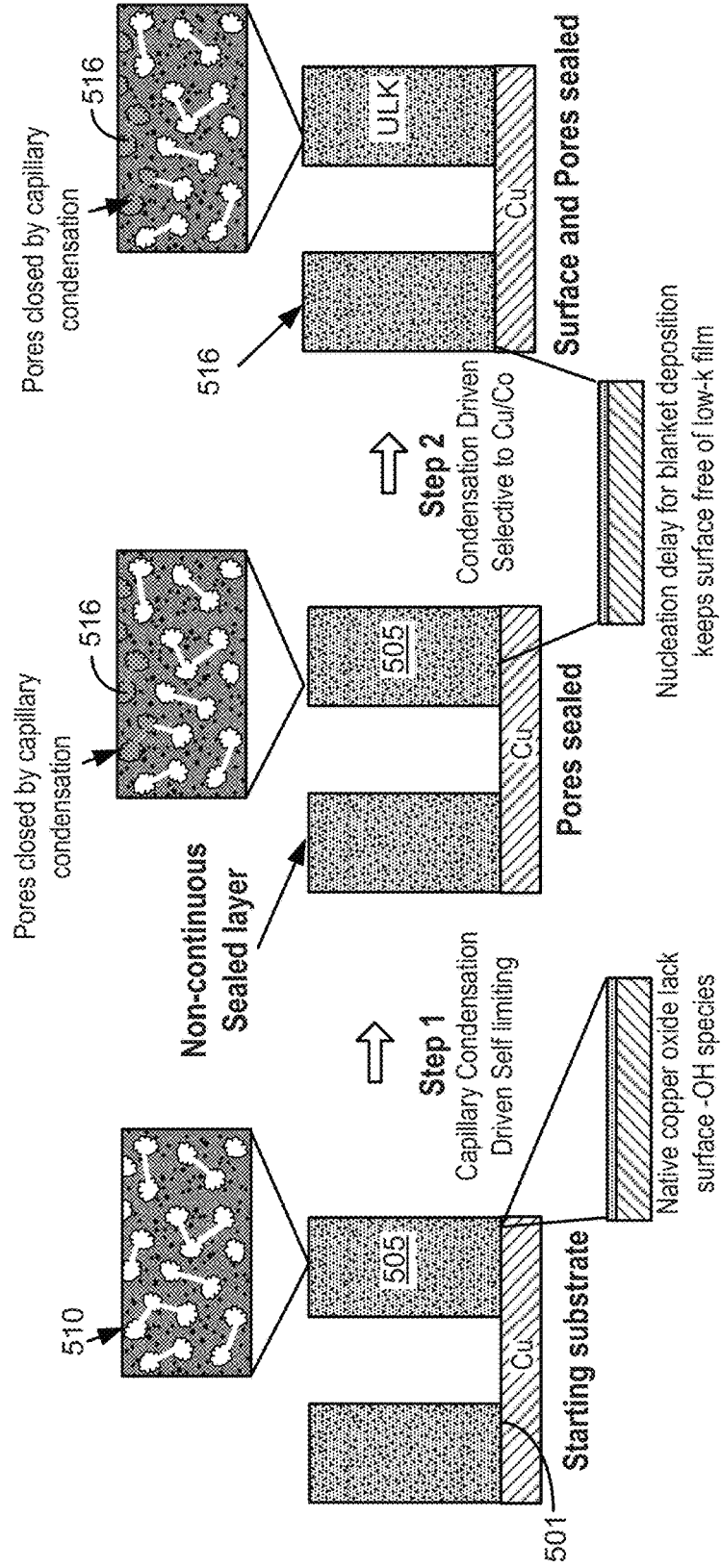
FIGS. 5A-5C are cross sectional diagrams illustrating stages in an example of pore sealing in a BEOL process.

FIGS. 5A-5C provide a schematic illustration of an example a process involving the two aspects of selectivity discussed above: preferential deposition due to capillary condensation in the pores and nucleation delay on the metal surfaces. First turning to FIG. 5A, etched ULK film 505 is on Cu surface 501. An enlarged section of the etched ULK film 505 including pores 510, which have terminal —OH groups is shown. The etched ULK film 505 may or may not have undergone a previous pre-treatment process to form —OH groups; even without such a pre-treatment, a ULK film may have abundant —OH terminations that result in a short nucleation delay.

FIG. 5B shows the structure of FIG. 5A after exposure to the dielectric precursor and an oxidant under conditions that allow capillary condensation of the reactants in the pores 510. Reaction conditions are discussed further below, and involve appropriately controlling the reactant partial pressures relative to their saturated vapor pressures, generally at relatively low temperatures, e.g., −20° C. to 100° C. The capillary condensation in the pores 510 may be self-limiting, stopping when the pores 510 are sealed with sealant material 516. At this stage, there may be a non-continuous sealed layer 512. Because the deposition is preferential to the capillary condensation that occurs in the pores, the sealant material 516 does not form on the surface of the ULK film 505 or on the Cu surface 501 at this stage. In some implementations, the deposition may be stopped at this time. Alternatively, the deposition may be allowed to proceed, with the reactants forming a condensed flowable film of sealant material on the surface of the ULK film 505. This is shown in FIG. 5C. Because there is a longer nucleation delay on the Cu surface 501 than on the ULK film 505 (due to the relative abundance of —OH terminations on the ULK film), there is a window of time in which the sealant material deposits on the surface of the ULK film 505, but not on the Cu surface 501.

Further examples of integration processes in which the pores of a porous dielectric may be sealed according to certain implementations are described below. In another example of pore sealing prior to metallization, a pore sealing operation may be used prior to a manganese (Mn) self-forming barrier process. Mn-based self-forming barriers can be used to further interconnect scaling by reducing both via and line resistance. Conformal Mn deposition by CVD or ALD may be used to form self-forming barriers at small dimensions (<30 nm) without causing metallization voids. However, the precursors used for conformal Mn deposition can penetrate into porous dielectrics. In one example of an integration process, the following sequence is employed: 1) dual damascene patterning in a ULK dielectric, 2) selective dielectric deposition to seal pores in the ULK dielectric; 3) conformal CVD or ALD Mn Deposition; 4) optional liner deposition such as PVD Ta, CVD Co, or CVD ruthenium (Ru); 5) Cu seed deposition; 6) Cu electroplating to fill the dual damascene structure; 7) high temperature anneal to create a manganese silicon oxide self-forming barrier; and 8) Cu CMP. The manganese silicon oxide film may be $MnSi_xO_y$, where x is 1-3 and y is 3-5.

In some implementations, a pore sealing operation may be performed prior to a post-CMP surface treatment. For example, a post-Cu CMP surface treatment is used to reduce CuO and improve interface adhesion between Cu and a cap layer to improve electromigration performance. However, the surface treatment may be performed by a plasma process that can damage a porous ULK material. A pore sealing process as described herein may be performed post-Cu CMP to seal pores and reduce or eliminate ULK damage from the plasma treatment. The selective dielectric deposition can improve selectivity of deposition of a cap by a selective CVD, ALD, or electroless deposition process. For example, a cobalt (Co) or cobalt tungsten phosphide (CoWP) cap may be advantageously deposited selectively on metal, with selectivity improved by the pore sealing operation. In one example of an integration process, the following sequence is employed: 1) dual damascene patterning in a ULK dielectric; 2) metallization processes to fill trench and via; 3) post-Cu CMP; 4) selective dielectric deposition to seal pores in the ULK dielectric; 5) plasma treatment prior to cap deposition; and 6) dielectric or metal cap deposition.

K-Recovery

As indicated above with respect to FIG. 1, in some implementations, an optional k-recovery operation may be performed. According to various implementations, k-recovery may be performed prior to the sealing operation or may be part of that operation. A k-recovery operation can involve exposure to a k-recovery agent. Depending on the implementation, the k-recovery agent may be the same or a different compound as the flowable dielectric precursor. In some implementations, a flowable dielectric precursor used to form, for example, carbon-containing flowable dielectric material, may be advantageously used as a k-recovery agent prior to or during the flowable dielectric deposition process as described above. These flowable dielectric precursors may contain methylated and/or other carbon-hydride moieties that can add carbon-containing species back into a ULK CDO after integration steps have "damaged" it by removing some of the carbon. Examples of such precursors are given below in the discussion of deposition chemistries.

Treatments in accordance with the methods described herein are effective for the repair of process-induced damage to the porous dielectric, for example, broken Si—$CH_3$ bonds in a carbon-containing low-k dielectric (e.g., ULK CDO) resulting from plasma etching or CMP. Applicable carbon containing low-k dielectrics typically have SiO-based backbones doped with carbon, in particular CDO (for example, those formed from octamethyl cyclotetrasiloxane (OMCTS), tetramethylcyclotetrasiloxane (TMCTS), dimethyldimethoxysilane (DMDMOS), and diethoxymethylsilane (DEMS) and other known CDO precursors), but may also include hybrid polymers incorporating both C, Si and O in the backbone.

In some implementations, the dielectric precursor includes Si—CHx groups that can repair a damaged porous dielectric surface and near-surface regions. In alternate implementations, k-recovery may involve a first operation to expose the porous dielectric film to a k-recovery agent that condenses inside the pores and treats the surfaces of pores, but does not result in significant sealing. It should be noted that for some deposition reactions, a Si—CHx treatment that methyl-terminates the surface is not conducive to flowable dielectric deposition.

In some implementations, k-recovery may occur at the time of sealant material deposition (e.g., block 106 in FIG. 1), exposure to the flowable dielectric precursor results in silylation of these regions of the porous dielectric. A k-recovery agent that does not terminate the surface with a group that is not conducive to flowable dielectric deposition should be used. For example, if methyl-terminated surfaces are not conducive to flowable dielectric deposition, examples of k-recovery agents that may also be used as dielectric precursors and/or catalysts for flowable dielectric deposition are aminosilanes, including aminosilanes having secondary amines. Examples of such compounds are provided U.S. patent application Ser. No. 14/464,196 titled "LOW-K OXIDE DEPOSITION BY HYDROLYSIS AND CONDENSATION", filed concurrently herewith and incorporated herein by reference.

In operations where the catalyst or dielectric precursor is employed as a k-recovery agent, the substrate may or may not be exposed the other constituents of the deposition chemistry (described further below) during k-recovery. A second operation that seals the pores after k-recovery may then be performed. Capillary condensation may be advantageously used for k-recovery as well as sealant deposition since it can be used to selectively condense in and react with the pores. In some implementations, k-recovery may be followed by a surface treatment that creates Si—OH terminations to facilitate flowable dielectric deposition.

In some implementations, a k-recovery operation may include exposure to UV radiation, instead of or in addition to exposure to a chemical k-recovery agent. In the latter case, the UV exposure may or may not be during exposure to the k-recovery agent.

Deposition Chemistries

For forming silicon oxides, the process gas reactants generally include a silicon-containing compound and an oxidant, and may also include a catalyst, a solvent (and/or other surfactant) and other additives. The gases may also include one or more dopant precursors, e.g., a carbon-, nitrogen-, fluorine-, phosphorous- and/or boron-containing gas. Sometimes, though not necessarily, an inert carrier gas is present. In certain embodiments, the gases are introduced using a liquid injection system. In certain embodiments, the silicon-containing compound and the oxidant are introduced via separate inlets or are combined just prior to introduction into the reactor in a mixing bowl and/or showerhead. The catalyst and/or optional dopant may be incorporated into one of the reactants, pre-mixed with one of the reactants or introduced as a separate reactant. The substrate can be then exposed to the process gases, for example, at block 106 of FIG. 1. As discussed further below, conditions in the reactor are such that the silicon-containing compound and the oxidant react to form a condensed flowable film on the substrate. Formation of the film may be aided by presence of a catalyst.

In certain embodiments, the silicon-containing precursor is an alkoxysilane. Alkoxysilanes that may be used include, but are not limited to, the following:

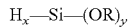

where $x=0-3$, $x+y=4$ and R is a substituted or unsubstituted alkyl group;

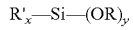

where $x=0-3$, $x+y=4$, R is a substituted or unsubstituted alkyl group and R' is a substituted or unsubstituted alkyl, alkoxy or alkoxyalkane group; and

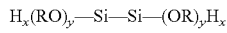

where $x=0-2$, $x+y=3$ and R is a substituted or unsubstituted alkyl group.

Examples of silicon containing precursors include, but are not limited to, alkoxysilanes, e.g., tetraoxymethylcyclotetrasiloxane (TOMCTS), octamethylcyclotetrasiloxane (OMCTS), tetraethoxysilane (TEOS), triethoxysilane (TES), trimethoxysilane (TriMOS), methyltriethoxyorthosilicate (MTEOS), tetramethylorthosilicate (TMOS), methyltrimethoxysilane (MTMOS), dimethyldimethoxysilane (DMDMOS), diethoxysilane (DES), dimethoxysilane (DMOS), triphenylethoxysilane, 1-(triethoxysilyl)-2-(diethoxymethylsilyl)ethane, tri-t-butoxylsilanol, hexamethoxydisilane (HMODS), hexaethoxydisilane (HEODS), tetraisocyanatesilane (TICS), bis-tert-butylamino silane (BTBAS), hydrogen silsesquioxane, tert-butoxydisilane, T8-hydridospherosiloxane, OctaHydro POSS™ (Polyhedral Oligomeric Silsesquioxane) and 1,2-dimethoxy-1,1,2,2-tetramethyldisilane. Further examples of silicon containing precursors include, but are not limited to, silane (SiH$_4$), disilane, trisilane, hexasilane, cyclohexasilane, and alkylsilanes, e.g., methylsilane, and ethylsilane.

In certain embodiments, carbon-doped silicon precursors are used, either in addition to another precursor (e.g., as a dopant) or alone. Carbon-doped precursors can include at least one Si—C bond. Carbon-doped precursors that may be used include, but are not limited to the, following:

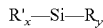

where $x=0-3$, $x+y=4$, R is a substituted or unsubstituted alkyl group and R' is a substituted or unsubstituted alkyl, alkoxy or alkoxyalkane group; and

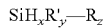

where $x=1-3$, $y=0-2$, $x+y+z=4$, R is a substituted or unsubstituted alkyl group and R' is a substituted or unsubstituted alkyl, alkoxy or alkoxyalkane group.

Examples of carbon-doped precursors are given above with further examples including, but not being limited to, trimethylsilane (3MS), tetramethylsilane (4MS), diethoxymethylsilane (DEMS), dimethyldimethoxysilane (DMDMOS), methyl-triethoxysilane (MTES), methyl-trimethoxysilane, methyl-diethoxysilane, methyl-dimethoxysilane, trimethoxymethylsilane, (TMOMS), dimethoxymethylsilane, and bis(trimethylsilyl)carbodiimide.

In certain embodiments aminosilane precursors are used. Aminosilane precursors include, but are not limited to, the following:

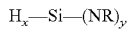

where $x=0-3$, $x+y=4$ and R is an organic of hydride group.

Examples of aminosilane precursors are given above, with further examples including, but not being limited to -tert-butylamino silane (BTBAS) or tris(dimethylamino)silane.

The size of the precursor may be tailored to the pore size of the porous dielectric film: it should be small enough that it fits in a pore, but large enough that it does not penetrate too deeply within the porous dielectric.

Examples of suitable oxidants include, but are not limited to, ozone (O$_3$), peroxides including hydrogen peroxide (H$_2$O$_2$), oxygen (O$_2$), water (H$_2$O), alcohols such as methanol, ethanol, and isopropanol, nitric oxide (NO), nitrous dioxide (NO$_2$) nitrous oxide (N$_2$O), carbon monoxide (CO) and carbon dioxide (CO$_2$). In certain embodiments, a remote plasma generator may supply activated oxidant species.

In certain embodiments, peroxides are reacted with silicon-containing precursors such as alkylsilanes to form flowable films including carbon-containing silanols. In other embodiments, Si—C or Si—N containing dielectric precursors may be used, either as a main dielectric precursor or a dopant precursor, to introduce carbon or nitrogen in the gel formed by a hydrolysis and condensation reaction as described above. For example, triethoxysilane may be doped with methyl-triethoxysilane (CH$_3$Si(OCH$_2$)$_3$) to introduce carbon into the as-deposited film. Still further, in certain embodiments the as-deposited film is a silicon nitride film, including primarily Si—N bonds with N—H bonds.

In certain embodiments, the flowable dielectric film may be a silicon and nitrogen-containing film, such as silicon nitride or silicon oxynitride. It may be deposited by introducing vapor phase reactants to a deposition chamber at conditions such that they react to form a flowable film. The vapor phase reactants may include species created by a plasma. Such a plasma may be generated remotely or in the deposition chamber. The nitrogen incorporated in the film may come from one or more sources, such as a silicon and nitrogen-containing precursor (for example, trisilyamine (TSA) or disilylamine (DSA)), a nitrogen precursor (for example, ammonia ($NH_3$) or hydrazine ($N_2H_4$)), or a nitrogen-containing gas fed into a plasma ($N_2$, $NH_3$, NO, $NO_2$, $N_2O$). After deposition, the flowable dielectric film may be treated to do one of more of the following: chemical conversion of the as-deposited film and densification. The chemical conversion may include removing some or all of the nitrogen component, converting a Si(ON)x film to a primarily SiO network. It may also include removal of one or more of —H, —OH, —CH and —NH species from the film. Such a film may be exposed to a post-deposition treatment as described further below. In certain embodiments, it may be primarily SiN after treatment; or may be oxidized to form a SiO network or a SiON network. Post-deposition conversion treatments may remove nitrogen and/or amine groups. Post-deposition treatments may include exposure to thermal, chemical, plasma, UV, IR or microwave energy One or more dopant precursors, catalysts, inhibitors, buffers, surfactants, solvents and other compounds may be introduced. In certain embodiments, a proton donor catalyst is employed. Examples of proton donor catalysts include 1) acids including nitric, hydrofluoric, phosphoric, sulphuric, hydrochloric and bromic acids; 2) carboxylic acid derivatives including R—COOH and R—C(=O)X where R is substituted or unsubstituted alkyl, aryl, acetyl or phenol and X is a halide, as well as R—COOC—R carboxylic anhydrides; 3) $Si_xX_yH_z$ where x=1-2, y=1-3, z=1-3 and X is a halide; 4) $R_xSi-X_y$ where x=1-3 and y=1-3; R is alkyl, aloxy, aloxyalkane, aryl, acetyl or phenol; and X is a halide; and 5) ammonia and derivatives including ammonium hydroxide, hydrazine, hydroxylamine, and R—$NH_2$ where R is substituted or unsubstituted alkyl, aryl, acetyl, or phenol.

In addition to the examples of catalysts given above, halogen-containing compounds which may be used include halogenated molecules, including halogenated organic molecules, such as dichlorosilane ($SiCl_2H_2$), trichlorosilane ($SiCl_3H$), methylchlorosilane ($SiCH_3ClH_2$), chlorotriethoxysilane, chlorotrimethoxysilane, chloromethyldiethoxysilane, chloromethyldimethoxysilane, vinyltrichlorosilane, diethoxydichlorosilane, and hexachlorodisiloxane. Acids which may be used may be mineral acids such as hydrochloric acid (HCl), sulphuric acid ($H_2SO_4$), and phosphoric acid ($H_3PO_4$); organic acids such as formic acid (HCOOH), acetic acid ($CH_3COOH$), and trifluoroacetic acid ($CF_3COOH$). Bases which may be used include ammonia ($NH_3$) or ammonium hydroxide ($NH_4OH$), phosphine ($PH_3$); and other nitrogen- or phosphorus-containing organic compounds. Additional examples of catalysts are chlorodiethoxysilane, methanesulfonic acid ($CH_3SO_3H$), trifluoromethanesulfonic acid ("triflic", $CF_3SO_3H$), chloro-dimethoxysilane, pyridine, acetyl chloride, chloroacetic acid ($CH_2ClCO_2H$), dichloroacetic acid ($CHCl_2CO_2H$), trichloroacetic acid ($CCl_3CO_2H$), oxalic acid ($HO_2CCO_2H$), benzoic acid ($C_6H_5CO_2H$), and triethylamine.

According to various embodiments, catalysts and other reactants may be introduced simultaneously or in particular sequences. For example, in some embodiments, an acidic compound may be introduced into the reactor to catalyze the hydrolysis reaction at the beginning of the deposition process, then a basic compound may be introduced near the end of the hydrolysis step to inhibit the hydrolysis reaction and the catalyze the condensation reaction. Acids or bases may be introduced by normal delivery or by rapid delivery or "puffing" to catalyze or inhibit hydrolysis or condensation reaction quickly during the deposition process. Adjusting and altering the pH by puffing may occur at any time during the deposition process, and difference process timing and sequence may result in different films with properties desirable for different applications. Some examples of catalysts are given above. Examples of other catalysts include hydrochloric acid (HCl), hydrofluoric acid (HF), acetic acid, trifluoroacetic acid, formic acid, dichlorosilane, trichlorosilane, methyltrichlorosilane, ethyltrichlorosilane, trimethoxychlorosilane, and triethoxychlorosilane. Methods of rapid delivery that may be employed are described in U.S. Pat. No. 8,278,224, incorporated by reference herein.

In addition to the catalysts described above, in some implementations, catalysts formulated for BEOL processing applications may be used. Such catalysts are disclosed in U.S. patent application Ser. No. 14/464,196 titled "LOW-K OXIDE DEPOSITION BY HYDROLYSIS AND CONDENSATION", filed concurrently herewith and incorporated herein by reference. Halogen-containing catalysts may react with the metallization layers that are exposed in some areas of the substrate—in particular, chlorides and bromides may be more susceptible to reacting with metallization layers. In one example, fluorides may corrode copper in an oxidizing regime or environment, so a fluorine-containing silicon precursor used to fill gaps or pores on the substrate may cause areas of the substrate to degrade. The degradation of these electrical properties on the substrate may eventually cause failure in microelectronic devices. Moreover, halide anions could be retained in the deposited film and leech out of a low-k dielectric layer and into other parts of the integrated structure, leading to corrosion during integration, longer processing times, and further processing steps. Halide anions also lead to mobile charges on the dielectric, which degrade the dielectric's insulating electrical properties.

In some implementations, halogen-free acid catalysts may be employed, with examples including 1) acids including nitric, phosphoric, sulfuric acids; and 2) carboxylic acid derivatives including R—COOH where R is substituted or unsubstituted alkyl, aryl, acetyl or phenol, as well as R—COOC—R carboxylic anhydrides.

Also in some implementations, self-catalyzing silane dielectric precursors including aminosilanes, may be used. Aminosilanes that may be used include, but are not limited to, the following: (1) $H_x$—Si—$(NR)_y$ where x=0-3, x+y=4 and R is an organic hydride group. Further examples of self-catalyzed dielectric precursors are provided in U.S. patent application Ser. No. 14/464,196 titled "LOW-K OXIDE DEPOSITION BY HYDROLYSIS AND CONDENSATION", filed concurrently herewith and incorporated herein by reference.

Surfactants may be used to relieve surface tension and increase wetting of reactants on the substrate surface. They may also increase the miscibility of the dielectric precursor with the other reactants, especially when condensed in the liquid phase. Examples of surfactants include solvents, alcohols, ethylene glycol and polyethylene glycol. Difference surfactants may be used for carbon-doped silicon precursors because the carbon-containing moiety often makes the precursor more hydrophobic.

Solvents may be non-polar or polar and protic or aprotic. The solvent may be matched to the choice of dielectric precursor to improve the miscibility in the oxidant. Non-polar solvents include alkanes and alkenes; polar aprotic solvents include acetones and acetates; and polar protic solvents include alcohols and carboxylic compounds.

Examples of solvents that may be introduced include alcohols, e.g., isopropyl alcohol, ethanol and methanol, or other compounds, such as ethers, carbonyls, nitriles, miscible with the reactants. Solvents are optional and in certain embodiments may be introduced separately or with the oxidant or another process gas. Examples of solvents include, but not limited to, methanol, ethanol, isopropanol, acetone, diethylether, acetonitrile, dimethylformamide, and dimethyl sulfoxide, tetrahydrofuran (THF), dichloromethane, hexane, benzene, toluene, isoheptane and diethylether. The solvent may be introduced prior to the other reactants in certain embodiments, either by puffing or normal delivery. In some embodiments, the solvent may be introduced by puffing it into the reactor to promote hydrolysis, especially in cases where the precursor and the oxidant have low miscibility.

Sometimes, though not necessarily, an inert carrier gas is present. For example, nitrogen, helium, and/or argon, may be introduced into the chamber with one of the compounds described above.

As indicated above, any of the reactants (silicon-containing precursor, oxidant or other co-reactant, solvent, catalyst, etc.) either alone or in combination with one or more other reactants, may be introduced prior to the remaining reactants. Also in certain embodiments, one or more reactants may continue to flow into the reaction chamber after the remaining reactant flows have been shut off. In certain embodiments, the silicon-containing precursor or catalyst that is also used for k-recovery may be introduced prior to the other reactants for low-k recovery of the porous dielectric.

Reactions conditions can be such that the silicon-containing compound and co-reactant undergo a condensation reaction, condensing on the substrate surface to form a flowable film. In certain embodiments, the reaction takes place in dark or non-plasma conditions. In other embodiments, the reaction takes place in the presence of a plasma, generated either remotely or in the deposition chamber. Methods of depositing a flowable film for gap fill via a plasma-enhanced chemical vapor deposition (PECVD) reaction are described in U.S. patent application Ser. No. 12/334,726, incorporated by reference herein.

Chamber pressure may be between about 1 and 200 Torr, in certain embodiments, it is between 10 and 75 Torr. In a particular embodiment, chamber pressure is about 10 Torr.

Partial pressures of the process gas components may be characterized in terms of component vapor pressure and range as follows, with Pp the partial pressure of the reactant and Pvp the vapor pressure of the reactant at the reaction temperature.

Precursor partial pressure ratio (Pp/Pvp)=0.01-1, e.g., 0.01-0.5

Oxidant partial pressure ratio (Pp/Pvp)=0.25-2, e.g., 0.5-1

Solvent partial pressure ratio (Pp/Pvp)=0-1, e.g, 0.1-1

In certain embodiments, the process gas is characterized by having a precursor partial pressure ratio is 0.01 and 0.5, an oxidant partial ratio between 0.5 and 1, and a solvent (if present) partial pressure ratio between 0.1 and 1. In the same or other embodiments, the process gas is characterized by the following:

Oxidant:Precursor partial pressure ratio ($Pp_{oxidant}/Pp_{precursor}$)=0.2-30, e.g., 5-15

Solvent:Oxidant partial pressure ratio ($Pp_{solvent}/Pp_{oxidant}$)=0-30, e.g., 0.1-5

In certain embodiments, the process gas is characterized by an oxidant:precursor partial pressure ratio of between about 5 and 15 and a solvent:oxidant partial pressure ration of between about 0.1 and 5.

Substrate temperature is between about −20° C. and 100° C. in certain embodiments. In certain embodiments, temperature is between about −20° C. and 30° C., e.g., between −10° C. and 10° C. Pressure and temperature may be varied to adjust deposition time; high pressure and low temperature are generally favorable for quick deposition. High temperature and low pressure will result in slower deposition time. Thus, increasing temperature may involve increasing pressure. In one embodiment, the temperature is about 5° C. and the pressure about 10 Torr. Exposure time depends on reaction conditions as well as pore size. Deposition rates are from about 100 angstroms/min to 1 micrometer/min according to various embodiments. The substrate is exposed to the reactants under these conditions for a period long enough to deposit a flowable film in the pores. In certain embodiments, deposition time is 0.1-5 seconds.

Figure 6:
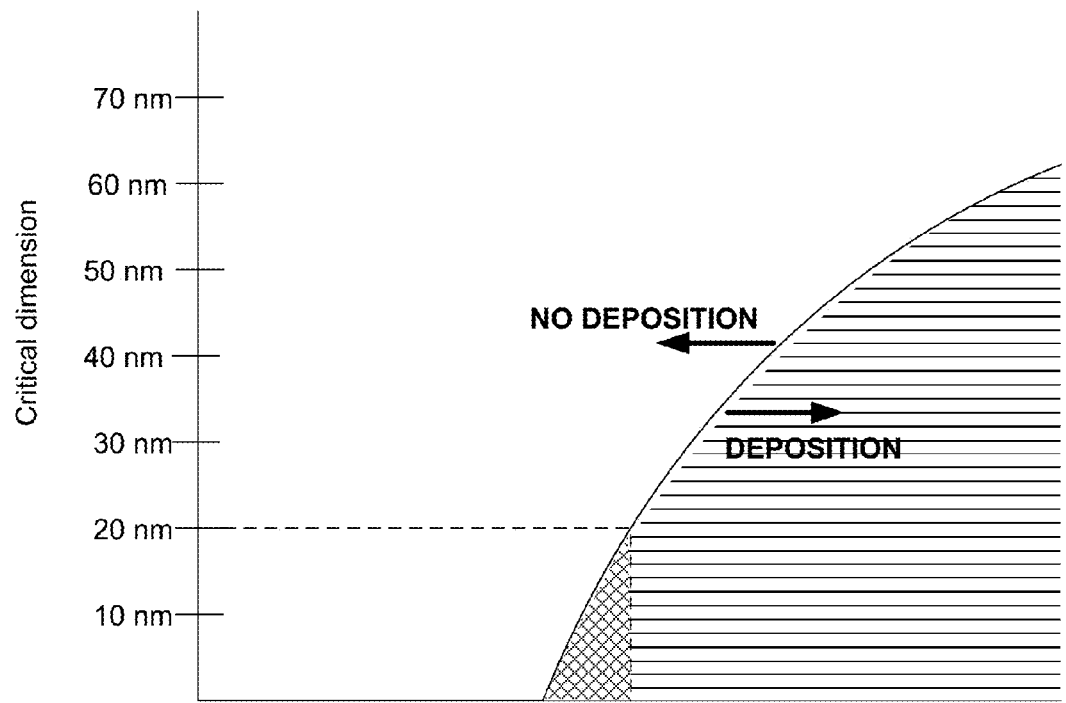
FIG. 6 is a schematic illustration of a graph showing an example of a critical dimension-partial pressure deposition curve.

The amount of condensation is controlled by the reactants' partial pressures relative to their saturated vapor pressures (which are constant for a given deposition temperature). The dependence of fill rate on critical dimension can be tuned by varying the partial pressures. In this manner, selectivity can be tuned, improving the capability to deposit in just the pores or as otherwise desired. This is illustrated qualitatively in FIG. 6, which shows a partial pressure-critical dimension deposition curve. At low enough partial pressure of the dielectric precursor, there is no condensation or deposition in features of any size. As the partial pressure is increased, the dielectric precursor condenses in small features, with deposition occurring in increasingly larger feature sizes as the partial pressure is increased. So, for example, to prevent deposition in a 20 nm etched trench of a ULK film while allowing deposition in the pores of the ULK film, the partial pressure of the dielectric precursor is maintained within the cross-hatched portion of the curve.

In some implementations, a continuous film may be allowed to deposit on the surface of a porous dielectric film. This is shown schematically in FIG. 5C, for example. As such, the partial pressure is controlled to allow formation of the film in the critical dimension of the trench. According to various implementations, the partial pressure may be constant at an appropriate level or raised after deposition in the pores. In some implementations, a termination agent such as a silylation agent may be introduced to terminate the surface and stop the reaction. Examples include (dimethylamino)trimethylsilane, which may methyl-terminate the surface and stop the reaction.

Post-Deposition Treatment

As noted above with reference to block 406 of FIG. 4, in some implementations, the flowable dielectric film may be treated post-deposition. In some implementations, the film is exposed to plasma species while it is still in a flowable, reactive state. As discussed in U.S. Provisional Patent Application No. 61/895,883, exposure to a plasma generated, for example, from a process gas having a primary component of hydrogen ($H_2$), helium (He), nitrogen ($N_2$) or argon (Ar). In such cases, the plasma exposure generally will take place at substantially the same temperature as the deposition such that the film does not undergo thermal-activated solidification. Such plasma exposure may be effective to densify the flowable film in the pore if the film is still in a flowable state. In some embodiments, the plasma exposure is effective to drive the overall deposition reaction closer to completion to form the flowable film.

In addition to or instead of exposing the film while it is in a thermal reactive state, block 406 of FIG. 4 may involve a post-deposition cure that may take place at a much higher temperature than the deposition temperature. Such a cure may further cross-linking, and remove terminal groups such as —OH and —H groups in the film, and further increase the density and hardness of the film. Depending on the film composition, the cure may also shrink the film.

The film may be cured by purely thermal anneal, exposure to a downstream or direct plasma, exposure to ultraviolet or microwave radiation or exposure to another energy source. Thermal anneal temperatures may be 300° C. or greater (depending on the allowable thermal budget). The treatment may be performed in an inert environment (Ar, He, etc.) or in a potentially reactive environment. Oxidizing environments (using $O_2$, $N_2O$, $O_3$, $H_2O$, $H_2O_2$, NO, $NO_2$, CO, $CO_2$ etc.) may be used, though in certain situation nitrogen-containing compounds will be avoided to prevent incorporation of nitrogen in the film. In other embodiments, nitridizing environments (using $N_2$, $N_2O$, $NH_3$, NO, $NO_2$ etc.) can be used and can incorporate a certain amount of nitrogen in the film. In some embodiments, a mix of oxidizing and nitridizing environments are used. Carbon-containing chemistries may be used to incorporate some amount of carbon into the deposited film. According to various embodiments, the composition of the densified film depends on the as-deposited film composition and the treatment chemistry. For example, in certain embodiments, an $Si(OH)_x$ as-deposited gel is converted to a SiO network using an oxidizing plasma cure. In other embodiments, an $Si(OH)x$ as-deposited gel is converted to a SiON network. In other embodiments, an $Si(NH)x$ as-deposited gel is converted to an SiON network.

In certain embodiments, the film is cured by exposure to a plasma, either remote or direct (inductive or capacitive). This may result in a top-down conversion of the flowable film to a densified solid film. The plasma may be inert or reactive. Helium and argon plasma are examples of inert plasmas; oxygen and steam plasmas are examples of oxidizing plasmas (used for example, to remove carbon as desired). Hydrogen-containing plasmas may also be used. An example of a hydrogen-containing plasma is a plasma generated from a mix of hydrogen gas ($H_2$) and a diluent such as inert gas. Temperatures during plasma exposure are typically about 25° C. or higher. In certain embodiments, an oxygen or oxygen-containing plasma is used to remove carbon. In some embodiments, temperature during plasma exposure can be lower, e.g., −15° C. to 25° C.

Temperatures during cures may range from 0-600° C., with the upper end of the temperature range determined by the thermal budget at the particular processing stage. In certain embodiments, the temperatures range from about 200° C.-550° C. Pressures may be from 0.1-10 Torr, with high oxidant pressures used for removing carbon.

Other annealing processes, including rapid thermal processing (RTP) may also be used to solidify and shrink the film. If using an ex situ process, higher temperatures and other sources of energy may be employed. Ex situ treatments include high temperature anneals (700-1000° C.) in an environment such as $N_2$, $O_2$, $H_2O$, Ar and He. In certain embodiments, an ex situ treatment involves exposing the film to ultraviolet radiation, e.g., in an ultraviolet thermal processing (UVTP) process. For example, temperatures of 100° C., or above, e.g., 100° C.-400° C., in conjunction with UV exposure may be used to cure the film. Other flash curing processes, including RTP or laser anneal, may be used as well.

EXPERIMENTAL

Example 1

A flowable oxide film was deposited in a 25 nm CD trench (25 nm opening) in a silicon (Si) substrate and on a blanket Si substrate. The flowable oxide deposition involved reacting methyltriethoxysilane with a water/IPA solution, in the presence of a chloride-containing catalyst (chloro-methyldiethoxysilane). The deposition took place at 0° C. and 45 Torr with flow ratios of H2O:IPA:precursor of 19:27:1. Film thicknesses in the trench and on the blanket substrate was measured at various deposition times, as shown in the table below:

| Deposition Time | Thickness in 25 nm trench | Thickness on blanket Si |
| --- | --- | --- |
| 5 seconds | 0 | 0 |
| 10 seconds | 20 nm | 1.4 nm |
| 25 seconds | 225 nm (complete fill) | 10.3 nm |

The above results demonstrate preferential fill in a reduced-spaced trench versus blanket film. This effect may be used in methods disclosed herein to preferentially deposit in pores over trenches.

Example 2

A porous ULK substrate was damaged by plasma etch and clean, and then subjected to an integration scheme similar to that shown in FIGS. 2A-2D, with a flowable low-k pore sealing process applied followed by deposition of a tantalum nitride (TaN) diffusion barrier, deposition of an ALD Co cap and subsequent anneal. Flowable oxide deposition involved reacting methyltriethoxysilane with a water/IPA solution, in the presence of a chloride-containing catalyst (chloro-methyldiethoxysilane). The deposition took place at 0° C. and 45 Torr with flow ratios of H2O:IPA:precursor of 19:27:1.

Example 3

Figure 7A:
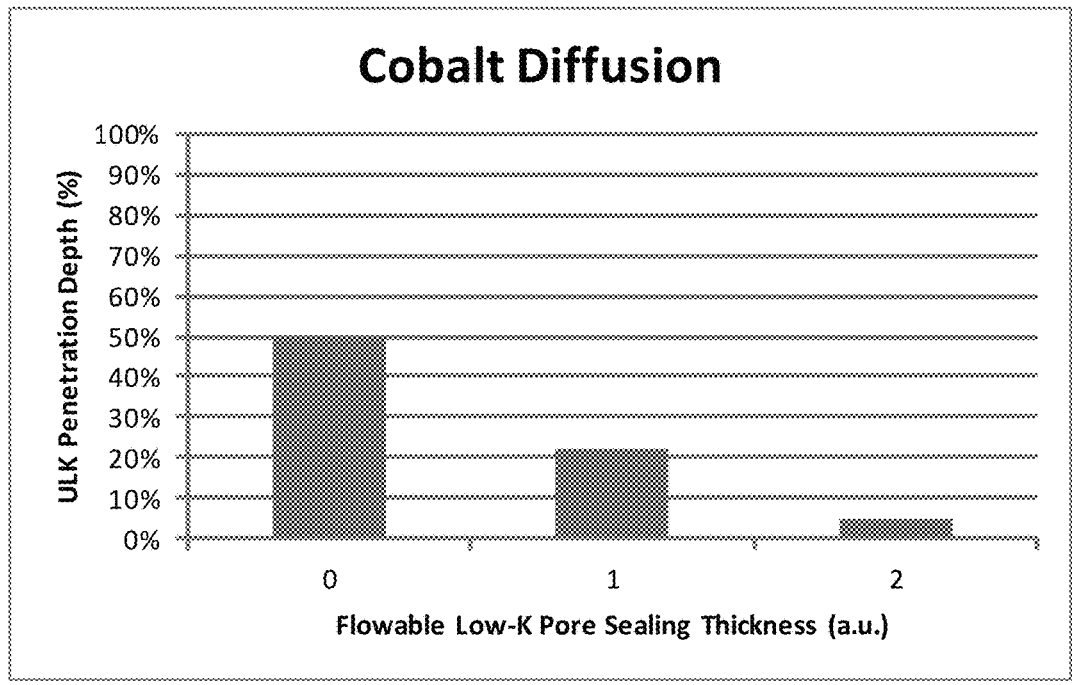
FIG. 7A is a chart illustrating the amount of cobalt diffusion in a ultra-low k (ULK) layer as a percentage of ULK layer thickness for ULK films having various degrees of pore sealing vs control.

A backside SIMS analysis was performed to determine the diffusion of Co through the TaN diffusion barrier as a function of low-k flowable oxide pore sealing thickness in arbitrary units (a.u.), with the results shown in FIG. 7. The control (0 a.u.) shows that the cobalt diffused down through about 50% of the ULK thickness. For split 1 of the flowable low-k pore sealing, that depth was reduced to about 22%. For split 2, in which the deposition was allowed to proceed for a longer time than in split 1, the Co diffusion was reduced to about 6%, effectively containing the Co to the very top of the ULK surface. This indicates that the pore sealing process prevents diffusion of the metal ALD precursor into the porous ULK.

Example 4

Flowable oxide was deposited in trenches of varying critical dimension (CD) for three processes A, B, and C. Only chamber pressure (and hence reactant partial pressures) were varied; deposition time was constant for all processes. Flowable oxide deposition involved reacting methyltriethoxysilane with a water/IPA solution, in the presence of a chloride-containing catalyst (chloro-methyldiethoxysilane). Total pressure was as follows for process A, B, and C, respectively: 20, 30 and 40 Torr.

The table below shows fill heights for various CD's and processes, with selectivity calculated as the ratio of the 10 nm feature fill height to the 60 nm fill

| Process | Feature CD | Fill Height | Selectivity |
|---------|------------|-------------|-------------|
| A | 10 nm | 392 | infinity |
|   | 40 nm | 0 | |
|   | 60 nm | 0 | |
| B | 10 nm | 392 | 33:1 |
|   | 40 nm | 54 | |
|   | 60 nm | 12 | |
| C | 10 nm | 392 | 1.7:1 |
|   | 40 nm | 356 | |
|   | 60 nm | 236 | | height. The results demonstrate that selectivity of fill in features can be controlled based on CD.

Example 5

Figure 7B:
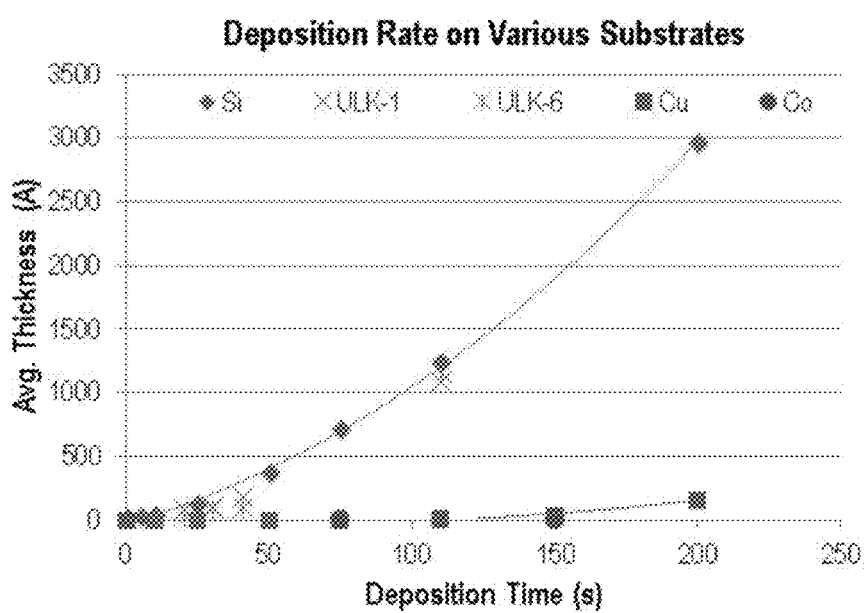
FIG. 7B is a graph illustrating flowable oxide deposition thickness on various substrate as a function of deposition time.

A flowable oxide film was deposited from reaction of methyltriethoxysilane with a water/IPA solution, in the presence of a chloride-containing catalyst (chloro-methyldiethoxysilane) on various surfaces, including a Si substrate, two types of ULK film, a Cu layer, and a Co layer. FIG. 7B shows the results, which demonstrate that the deposition is selective to the ULK film over the metal films.

Apparatus

The methods disclosed herein may be performed on a wide-range of modules. The methods may be implemented on any apparatus equipped for deposition of dielectric film, including HDP-CVD reactors, PECVD reactors, sub-atmospheric CVD reactors, any chamber equipped for CVD reactions, and chambers used for PDL (pulsed deposition layers).

Such an apparatus may take many different forms. Generally, the apparatus will include one or more modules, with each module including a chamber or reactor (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). While in process, each wafer is held in place by a pedestal, wafer chuck and/or other wafer holding apparatus. For certain operations in which the wafer is to be heated, the apparatus may include a heater such as a heating plate.

Figure 8A:
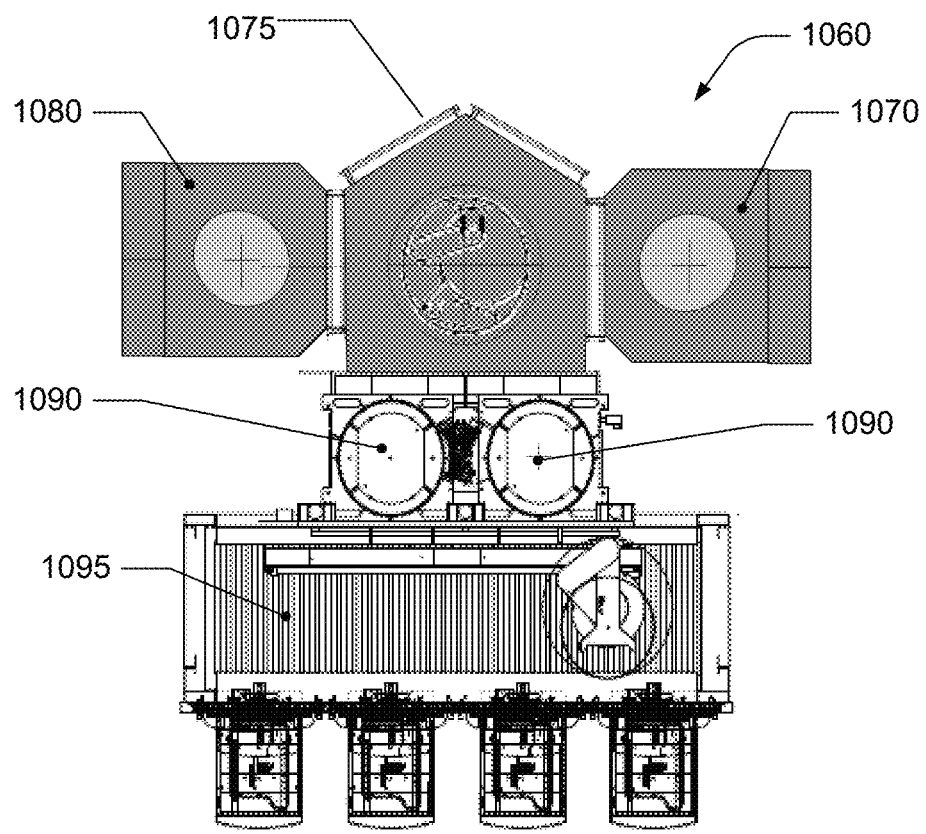
FIGS. 8A, 8B and 9 are schematic illustrations of apparatus suitable to practice the methods described herein.

In performed, a pre-treatment may take place in the same or different module as the flowable dielectric deposition. FIG. 8A shows an example tool configuration 1060 including wafer transfer system 1095 and loadlocks 1090, flowable deposition module 1070, and pre-deposition treatment module 1080. Additional modules, such as a post-deposition treatment module, and/or one or more additional deposition modules 1070 or cure modules 1080 may also be included.

Modules that may be used for pre-treatment or cure include SPEED or SPEED Max, NOVA Reactive Preclean Module (RPM), Altus ExtremeFill (EFx) Module, Vector Extreme Pre-treatment Module (for plasma, ultra-violet or infra-red pre-treatment or cure), SOLA (for UV pre-treatment or cure), and Vector or Vector Extreme modules. These modules may be attached to the same backbone as the flowable deposition module. Also, any of these modules may be on different backbones. A system controller may be connected to any or all of the components of a tool; its placement and connectivity may vary based on the particular implementation. An example of a system controller is described below with reference to FIG. 9.

Figure 8B:
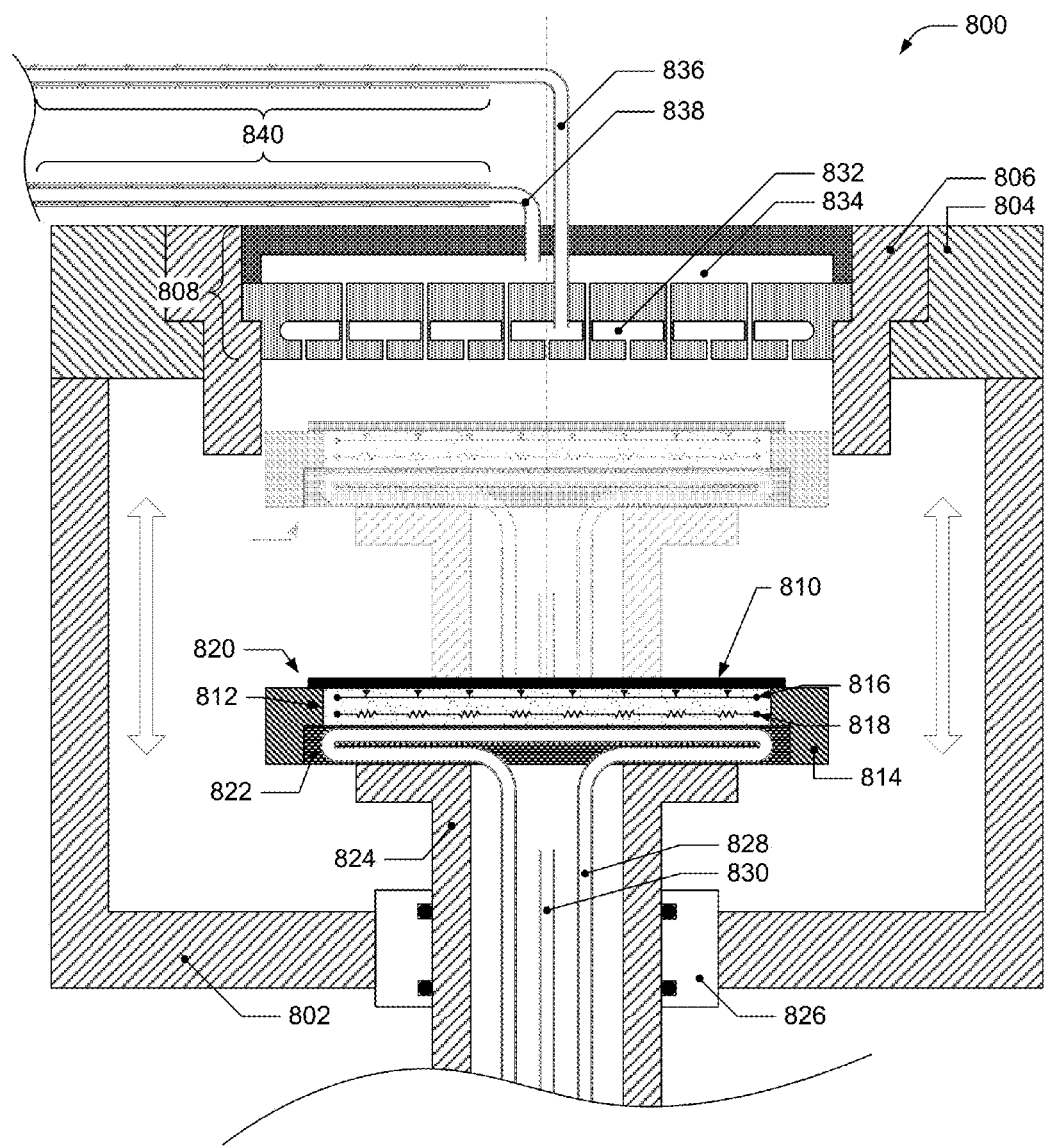

FIG. 8B shows an example of a deposition chamber for flowable dielectric deposition. A deposition chamber 800 (also referred to as a reactor, or reactor chamber) includes chamber housing 802, top plate 804, skirt 806, showerhead 808, pedestal column 824, and seal 826 provide a sealed volume for flowable dielectric deposition. Wafer 810 is supported by chuck 812 and insulating ring 814. Chuck 812 includes RF electrode 816 and resistive heater element 818. Chuck 812 and insulating ring 814 are supported by pedestal 820, which includes platen 822 and pedestal column 824. Pedestal column 824 passes through seal 826 to interface with a pedestal drive (not shown). Pedestal column 824 includes platen coolant line 828 and pedestal purge line 830. Showerhead 808 includes co-reactant-plenum 832 and precursor-plenum 834, which are fed by co-reactant-gas line 836 and precursor-gas line 838, respectively. Co-reactant-gas line 836 and precursor-gas line 838 may be heated prior to reaching showerhead 808 in zone 840. While a dual-flow plenum is described herein, a single-flow plenum may be used to direct gas into the chamber. For example, reactants may be supplied to the showerhead and may mix within a single plenum before introduction into the reactor. 820' and 820 refer to the pedestal, but in a lowered (820) and raised (820') position.

The chamber is equipped with, or connected to, gas delivery system for delivering reactants to reactor chamber 800. A gas delivery system may supply chamber 810 with one or more co-reactants, such as oxidants, including water, oxygen, ozone, peroxides, alcohols, etc. which may be supplied alone or mixed with an inert carrier gas. The gas delivery system may also supply chamber with one or more dielectric precursors, for example triethoxysilane (TES), which may be supplied alone or mixed with an inert carrier gas. The gas delivery system is also configured to deliver one or more treatment reagents, for plasma treatment as described herein reactor cleaning. For example, for plasma processing, hydrogen, argon, nitrogen, oxygen or other gas may be delivered.

Deposition chamber 800 serves as a sealed environment within which flowable dielectric deposition may occur. In many embodiments, deposition chamber 800 features a radially symmetric interior. Reducing or eliminating departures from a radially symmetric interior helps ensure that flow of the reactants occurs in a radially balanced manner over wafer 810. Disturbances to the reactant flows caused by radial asymmetries may cause more or less deposition on some areas of wafer 810 than on other areas, which may produce unwanted variations in wafer uniformity.

Deposition chamber 800 includes several main components. Structurally, deposition chamber 800 may include a chamber housing 802 and a top plate 804. Top plate 804 is configured to attach to chamber housing 802 and provide a seal interface between chamber housing 802 and a gas distribution manifold/showerhead, electrode, or other module equipment. Different top plates 804 may be used with the same chamber housing 802 depending on the particular equipment needs of a process.

Chamber housing 802 and top plate 804 may be machined from an aluminum, such as 6061-T6, although other materials may also be used, including other grades of aluminum, aluminum oxide, and other, non-aluminum materials. The use of aluminum allows for easy machining and handling and makes available the elevated heat conduction properties of aluminum.

Top plate 804 may be equipped with a resistive heating blanket to maintain top plate 804 at a desired temperature. For example, top plate 804 may be equipped with a resistive heating blanket configured to maintain top plate 804 at a temperature of between −20° C. and 100° C. Alternative heating sources may be used in addition to or as an alternative to a resistive heating blanket, such as circulating heated liquid through top plate 804 or supplying top plate 804 with a resistive heater cartridge.

Chamber housing 802 may be equipped with resistive heater cartridges configured to maintain chamber housing 802 at a desired temperature. Other temperature control systems may also be used, such as circulating heated fluids through bores in the chamber walls. The chamber interior walls may be temperature-controlled during flowable dielectric to a temperature between −20° C. and 100° C. In some implementations, top plate 804 may not include heating elements and may instead rely on thermal conduction of heat from chamber resistive heater cartridges to maintain a desired temperature. Various embodiments may be configured to temperature-control the chamber interior walls and other surfaces on which deposition is undesired, such as the pedestal, skirt, and showerhead, to a temperature approximately 10° C. to 40° C. higher than the target deposition process temperature. In some implementations, these components may be held at temperatures above this range.

Through actively heating and maintaining deposition chamber 800 temperature during processing, the interior reactor walls may be kept at an elevated temperature with respect to the temperature at which wafer 810 is maintained. Elevating the interior reactor wall temperature with respect to the wafer temperature may minimize condensation of the reactants on the interior walls of deposition chamber 800 during flowable film deposition. If condensation of the reactants occurs on the interior walls of deposition chamber 800, the condensate may form a deposition layer on the interior walls, which is undesirable.

In addition to, or alternatively to, heating chamber housing 802 and/or top plate 804, a hydrophobic coating may be applied to some or all of the wetted surfaces of deposition chamber 800 and other components with wetted surfaces, such as pedestal 820, insulating ring 814, or platen 822, to prevent condensation. Such a hydrophobic coating may be resistant to process chemistry and processing temperature ranges, e.g., a processing temperature range of −20° C. to 100° C. Some silicone-based and fluorocarbon-based hydrophobic coatings, such as polyethylene, may not be compatible with an oxidizing, e.g., plasma, environment and may not be suitable for use. Nano-technology based coatings with super-hydrophobic properties may be used; such coatings may be ultra-thin and may also possess oleophobic properties in addition to hydrophobic properties, which may allow such a coating to prevent condensation as well as deposition of many reactants, used in flowable film deposition. One example of a suitable super-hydrophobic coating is titanium dioxide ($TiO_2$).

Deposition chamber 800 may also include remote plasma source port, which may be used to introduce plasma process gases into deposition chamber 800. For example, a remote plasma source port may be provided as a means of introducing a treatment gas to the reaction area without requiring that the treatment gas be routed through showerhead 808. In some embodiments, remote plasma species may be routed through the showerhead 808.

In the context of plasma treatment, a direct plasma or a remote plasma may be employed. In the former case, the treatment gas may be routed through the showerhead. Showerhead 808 may include heater elements or heat conduction paths which may maintain the showerhead temperature within acceptable process parameters during processing. If a direct plasma is to be employed, showerhead 808 may also include an RF electrode for generating plasma environments within the reaction area. Pedestal 820 may also include an RF electrode for generating plasma environments within the reaction area. Such plasma environments may be generated using capacitative coupling between a powered electrode and a grounded electrode; the powered electrode, which may be connected with a plasma generator, may correspond with the RF electrode in showerhead 808. The grounded electrode may correspond with the pedestal RF electrode. Alternative configurations are also possible. The electrodes may be configured to produce RF energy in the 13.56 MHz range, 27 MHz range, or, more generally, between 50 Khz and 60 MHz. In some embodiments, there may be multiple electrodes provided which are each configured to produce a specific frequency range of RF energy. In embodiments wherein showerhead 808 includes a powered RF electrode, chuck 812 may include or act as the grounded RF electrode. For example, chuck 812 may be a grounded aluminum plate, which may result in enhanced cooling across the pedestal-chuck-wafer interface due to aluminum's higher thermal conductivity with respect to other materials, such as ceramics.

Figure 9:
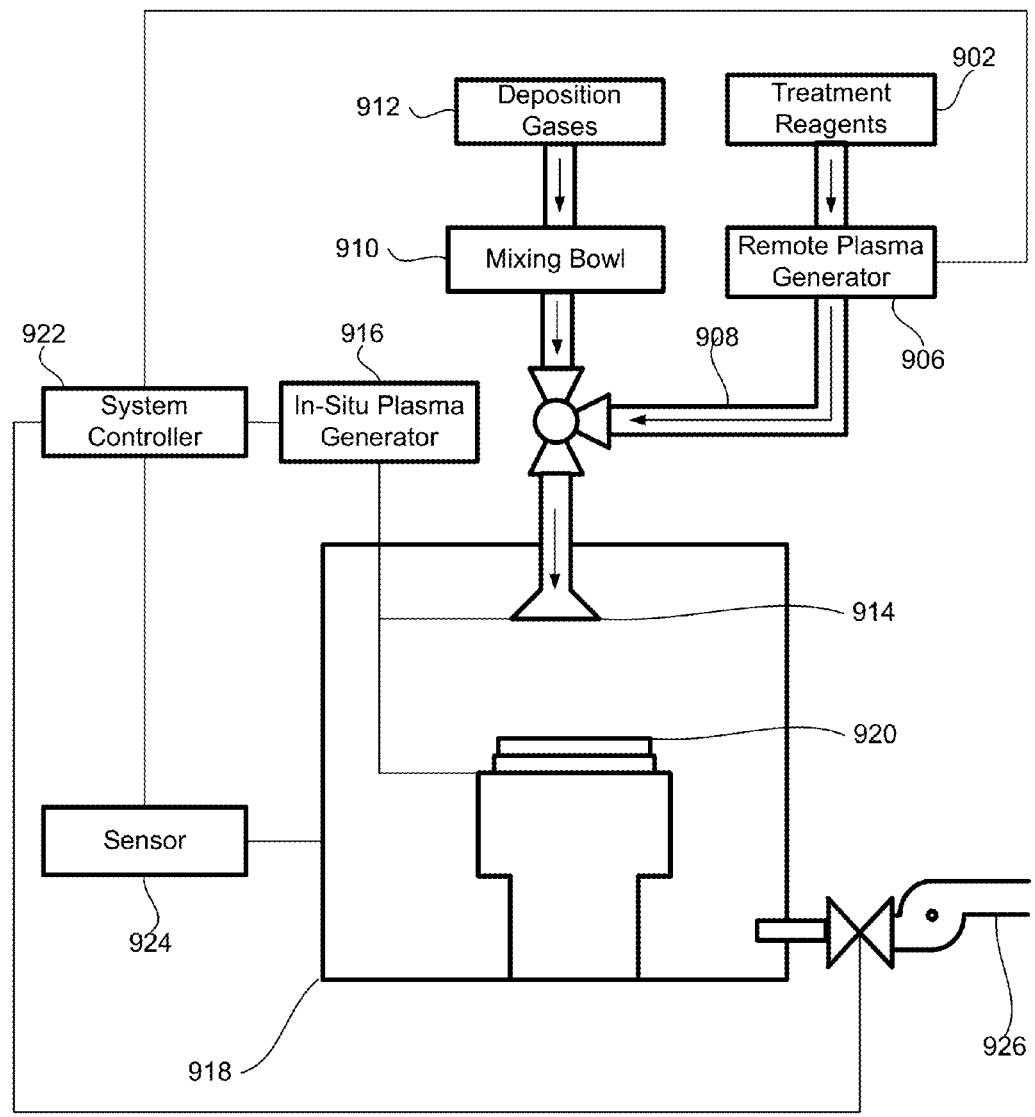

FIG. 9 is a schematic illustration of another example of an apparatus 900 suitable to practice the methods disclosed herein. In this example, the apparatus 900 may be used for flowable dielectric deposition and in situ or remote plasma pre or post treatment. The apparatus 900 includes a processing chamber 918 and a remote plasma generator 906. The processing chamber 918 includes a pedestal 920, a showerhead 914, a control system 922 and other components described below. In the example of FIG. 9, the apparatus 900 also includes a RF generator 916, though this may not be present in some embodiments.

Treatment reagents, such as H2, He, Ar, N2, may be supplied to the remote plasma generator 906 from various treatment reagent sources, such as source 902. A treatment reagent source may be a storage tank containing one or a mixture of reagents. Moreover, a facility wide source of the reagents may be used. The treatment reagent mixture may then be flown through a connecting line 908 into the processing chamber 918, where the mixture is distributed through the showerhead 914 to treat the wafer or other substrate on the pedestal 920.

The chamber 918 may include sensors 924 for sensing various materials and their respective concentrations, pressure, temperature, and other process parameters and providing information on reactor conditions during the process to the system controller 922. Examples of chamber sensors that may be monitored during the process include mass flow controllers, pressure sensors such as manometers, and thermocouples located in pedestal. Sensors 924 may also include an infra-red detector or optical detector to monitor presence of gases in the chamber. Volatile byproducts and other excess gases are removed from the reactor 918 via an outlet 926 that may include a vacuum pump and a valve.

In certain embodiments, a system controller 922 is employed to control process conditions deposition and/or pre or post-treatment. The system controller 922 will typically include one or more memory devices and one or more processors. The processor may include a CPU or computer, analog and/or digital input/output connections, stepper motor controller boards, etc. Typically there will be a user interface associated with system controller 922. The user interface may include a display screen, graphical software displays of the apparatus and/or process conditions, and user input devices such as pointing devices, keyboards, touch screens, microphones, etc.

In certain embodiments, the system controller 922 may also control all of the activities during the process, including gas flow rate, chamber pressure, generator process parameters. The system controller 922 executes system control software including sets of instructions for controlling the timing, mixture of gases, chamber pressure, pedestal (and substrate) temperature, and other parameters of a particular process. The system controller may also control concentration of various process gases in the chamber by regulating valves, liquid delivery controllers and MFCs in the delivery system as well as flow restriction valves and the exhaust line. The system controller executes system control software including sets of instructions for controlling the timing, flow rates of gases and liquids, chamber pressure, substrate temperature, and other parameters of a particular process. Other computer programs stored on memory devices associated with the controller may be employed in some embodiments. In certain embodiments, the system controller controls the transfer of a substrate into and out of various components of the apparatuses.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code and pressure control code.

The controller parameters relate to process conditions such as, for example, timing of each operation, pressure inside the chamber, substrate temperature, and process gas flow rates. These parameters are provided to the user in the form of a recipe, and may be entered utilizing the user interface. Signals for monitoring the process may be provided by analog and/or digital input connections of the system controller. The signals for controlling the process are output on the analog and digital output connections of the apparatus.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The disclosed methods and apparatuses may also be implemented in systems including lithography and/or patterning hardware for semiconductor fabrication. Further, the disclosed methods may be implemented in a process with lithography and/or patterning processes preceding or following the disclosed methods. The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Although the foregoing has been described in some detail for purposes of clarity of understanding, it will be apparent that certain changes and modifications may be practiced within the scope of the appended claims. It should be noted that there are many alternative ways of implementing the processes, systems and apparatus disclosed herein. Accordingly, the present embodiments are to be considered as illustrative and not restrictive, and the invention is not to be limited to the details given herein.

What is claimed is:

1. A method of sealing pores in a porous dielectric layer having an external surface and pores open to the external surface, comprising:
   introducing a vapor phase silicon-containing dielectric precursor and an inorganic oxidant into a process chamber, the process chamber housing a substrate maintained at a substrate temperature lower than the vaporization temperature of the silicon-containing dielectric precursor, wherein the partial pressure of the silicon-containing dielectric precursor is below the saturation pressure of the silicon-containing dielectric precursor at the substrate temperature;
   condensing the vapor phase silicon-containing dielectric precursor in the pores of the porous dielectric layer;
   reacting the condensed silicon-containing dielectric precursor with the inorganic oxidant to deposit a flowable silicon-containing dielectric film by capillary condensation in the pores of the porous dielectric layer without forming a continuous silicon-containing film on the external surface of the porous dielectric layer.

2. The method of claim 1, wherein the porous dielectric layer includes a recessed region formed therein, such that the external surface includes a surface of the recessed region, wherein pores recessed from the recess region surface are sealed by the deposited flowable silicon-containing dielectric film.

3. The method of claim 2, wherein the deposition of the flowable silicon-containing dielectric film is performed without substantial deposition in the recessed region.

4. The method of claim 2, further comprising forming a metal-containing layer on the recessed region surface.

5. The method of claim 4, wherein the metal-containing layer is a manganese silicon oxide.

6. The method of claim 2, further comprising filling the recessed region with a metal.

7. The method of claim 2, wherein the recessed region includes an exposed metal surface, an exposed metal nitride surface, or an exposed metal oxide surface.

8. The method of claim 7, wherein deposition of the flowable silicon-containing dielectric film is performed without deposition on the metal, metal nitride or metal oxide surface.

9. The method of claim 1, further comprising performing a post-deposition treatment of the flowable silicon-containing dielectric film.

10. The method of claim 1, wherein the flowable silicon-containing dielectric film is a doped or undoped silicon oxide, carbon-doped silicon oxide, silicon oxynitride, or silicon nitride material.

11. The method of claim 1, wherein the substrate temperature is between about −20° C. and 100° C.

12. The method of claim 1, further comprising exposing the porous dielectric layer to the silicon-containing dielectric precursor to thereby replace bonds in the porous dielectric layer.

13. The method of claim 1, wherein the silicon-containing dielectric precursor is an alkoxysilane.

14. The method of claim 1, wherein the silicon-containing dielectric precursor is an alkylsilane.

15. The method of claim 1, wherein the silicon-containing dielectric precursor is an aminosilane.

16. The method of claim 1, further comprising introducing a non-halogenated catalyst into the process chamber.

17. The method of claim 1, wherein the flowable silicon-containing dielectric film is a carbon-doped flowable dielectric film.

18. The method of claim 1, further comprising performing a plasma treatment after selective deposition in the pores and prior to metal cap deposition.

19. A method comprising:
   providing a porous interlayer dielectric (ILD) layer having a trench, via or other recessed region formed therein exposing a metal surface;
   introducing exposing the porous ILD layer to a vapor phase silicon-containing dielectric precursor in a hydrolyzing medium below the saturation pressure of the vapor phase silicon-containing dielectric precursor;
   selectively condensing the silicon-containing dielectric precursor in at least the openings of the pores of the porous ILD layer and hydrolyzing the condensed silicon-containing dielectric precursor without forming a dielectric film on the metal surface;
   forming a metal-containing barrier layer in the trench; and
   filling the trench with a conductive material.

* * * * *